US010278295B2

(12) United States Patent
Chin et al.

(10) Patent No.: US 10,278,295 B2
(45) Date of Patent: Apr. 30, 2019

(54) FRAME-TYPE OPTICAL MEMBER WITH OPTICAL FIBER AND MULTI-PANEL DISPLAY DEVICE WITH SAME

(71) Applicant: LG Display Co., Ltd., Seoul (KR)

(72) Inventors: MiHyung Chin, Paju-si (KR); JeongMin Moon, Goyang-si (KR); Sejin Lee, Icheon-si (KR)

(73) Assignee: LG Display Co., Ltd., Seoul (KR)

( * ) Notice: Subject to any disclaimer, the term of this patent is extended or adjusted under 35 U.S.C. 154(b) by 62 days.

(21) Appl. No.: 15/145,777

(22) Filed: May 3, 2016

(65) Prior Publication Data
US 2017/0094814 A1    Mar. 30, 2017

(30) Foreign Application Priority Data

Sep. 25, 2015 (KR) .......................... 10-2015-0136750
Feb. 22, 2016 (KR) .......................... 10-2016-0020352

(51) Int. Cl.
*G02B 6/08* (2006.01)
*G02B 6/036* (2006.01)
(Continued)

(52) U.S. Cl.
CPC ............ *H05K 5/0017* (2013.01); *G02B 6/00* (2013.01); *G02B 6/08* (2013.01); *G02F 1/13336* (2013.01); *G02F 1/133524* (2013.01); *H01L 27/3293* (2013.01); *B29D 11/00721* (2013.01); *B29K 2101/12* (2013.01); *B29K 2105/253* (2013.01); *B29K 2995/0031* (2013.01); *C03B 23/0013* (2013.01); *G02B 6/03616* (2013.01); *G02B 6/03638* (2013.01)

(58) Field of Classification Search
CPC ....................... G02F 1/13336; G02F 1/133524
See application file for complete search history.

(56) References Cited

U.S. PATENT DOCUMENTS 5,465,315 A * 11/1995 Sakai ........................ G02B 6/06
                                                             385/116
6,628,874 B1    9/2003 Sugawara
(Continued)

FOREIGN PATENT DOCUMENTS

CN          1298492 A     6/2001
CN          1776468 A     5/2006
(Continued)

OTHER PUBLICATIONS

European Extended Search Report, European Application No. 16178553.0, dated Feb. 17, 2017, 13 pages.
(Continued)

*Primary Examiner* — Omar R Rojas
(74) *Attorney, Agent, or Firm* — Fenwick & West LLP

(57) ABSTRACT

In a multi-panel display device in which plural individual display devices are joined, it is possible to guarantee image continuity in panel junction areas of the multi-panel display device by disposing a frame-type optical member, which includes a frame section having plural optical fibers and a central light-transmitting area, on the front surface of the multi-panel display device and optimizing structures of an inner inclined surface of the frame section of the frame-type optical member and optical fibers included in the frame section.

20 Claims, 41 Drawing Sheets

(51) Int. Cl.
  *H01L 27/32* (2006.01)
  *B29K 101/12* (2006.01)
  *G02B 6/00* (2006.01)
  *G02F 1/1333* (2006.01)
  *G02F 1/1335* (2006.01)
  *H05K 5/00* (2006.01)
  *B29D 11/00* (2006.01)
  *C03B 23/00* (2006.01)
  *B29K 105/00* (2006.01)

(56) References Cited

U.S. PATENT DOCUMENTS

| | | |
|---|---|---|
| 8,780,015 B2 | 7/2014 | Watanabe |
| 9,494,733 B2 | 11/2016 | Wu |
| 9,733,427 B2 | 8/2017 | Wu |
| 2006/0244923 A1 | 11/2006 | Mitani et al. |
| 2009/0322985 A1 | 12/2009 | Mizuuchi |
| 2011/0025594 A1 | 2/2011 | Watanabe |
| 2014/0218961 A1 | 8/2014 | Wu |
| 2014/0354920 A1* | 12/2014 | Jang .................... G02F 1/13336 349/73 |
| 2015/0093086 A1* | 4/2015 | Wu .......................... G02B 6/08 385/132 |
| 2017/0031093 A1 | 2/2017 | Wu |

FOREIGN PATENT DOCUMENTS

| | | |
|---|---|---|
| CN | 101495912 A | 7/2009 |
| CN | 101965604 A | 2/2011 |
| CN | 103969734 A | 8/2014 |
| CN | 104516137 A | 4/2015 |
| EP | 1076247 A1 | 2/2001 |

OTHER PUBLICATIONS

First Chinese Office Action, Chinese Patent Application No. 201610577337.8, dated Feb. 19, 2019, 12 pages.

* cited by examiner $\theta_W \sim \theta_1$

FRAME-TYPE OPTICAL MEMBER WITH OPTICAL FIBER AND MULTI-PANEL DISPLAY DEVICE WITH SAME

CROSS REFERENCE TO RELATED APPLICATIONS

This application claims priority from and the benefit under the benefit under 35 U.S.C. § 119(a) of Republic of Korea Patent Application Number 10-2015-0136750 filed on Sep. 25, 2015 and Republic of Korea Patent Application Number 10-2016-0020352 filed on Feb. 22, 2016, which is hereby incorporated by reference for all purposes as if fully set forth herein.

BACKGROUND OF THE INVENTION

Field of the Invention

Embodiments of the present invention relate to a multi-panel display device including plural individual display devices are adjoined to form a single large-scale image output device, and more particularly, to a multi-panel display device displaying continuous image junction areas of individual display devices.

Discussion of the Related Art

With progress of information society, there is more need for a display device displaying images in various forms and various display devices. The display devices include liquid crystal display devices, plasma display devices, and organic light emitting display devices.

There is a need for a large-size display device for the commercial purposes. However, the size of a display panel constituting a display device is currently restricted. Hence, a multi-panel display device in which plural individual display panels or display devices are joined to display a single large image has been used as a large-scale display device. Such a multi-panel display device is referred to as a video wall.

Each of the individual display panel or display devices constituting such a multi-panel display device includes a central active area in which an image is displayed and a non-active area which is disposed around the active area and in which an image is not displayed. The non-active area has a frame shape with a constant width to surround an edge of the display panel. Such non-active area is referred to as a bezel area. The non-active area or the bezel area is an indispensable part that includes gate driving circuit, a data driving circuit, and various signals lines for driving the display panel.

SUMMARY

Embodiments relate to a multi-panel display device comprising a plurality of adjoining individual display devices and an optical member on the plurality of individual display device. The optical member includes a frame section covering junction areas of the individual display devices where images are not displayed and portions of display areas of the individual display devices adjacent to the junction areas. The frame section comprises a plurality of light conduits of a first refractive index and cladding portions of a second refractive index lower than the first refractive index. The cladding portions surround the plurality of light conduits.

In one embodiment, each of the light conduits comprises a first surface configured to receive light from the covered portions of the display areas, and a second surface facing away from the individual display device.

In one embodiment, a center of the second surface is shifted towards a junction area relative to a center of the first surface. The junction area is adjacent to a portion of the frame section that includes each of the light conduits.

In one embodiment, a portion of the frame section is defined at least by a bottom surface facing a display area of an individual display device, an inner inclined surface extending from the bottom surface and facing away from the individual display device, and an outer inclined surface extending from the bottom surface. The outer inclined surface extends over a non-display area of the display device and facing a junction area between the individual display device and an adjacent individual display device.

In one embodiment, a first acute angle between the inner inclined surface and the bottom surface is smaller than a second acute angle between the outer inclined surface and the bottom surface.

In one embodiment, the multi-panel display device further includes a refraction compensating member on a side of the inner inclined surface. Light received from the inclined surface is refracted by the refraction compensation member in a direction perpendicular to surfaces of the individual display devices.

In one embodiment, the refraction compensating member includes a first surface facing the inner inclined surface, and a second surface facing away from the inner inclined surface. The first surface forms an acute angle relative to the second surface.

In one embodiment, the multi-panel display device includes a viewing angle increasing plate between the refraction compensating member and the inner inclined surface. The viewing angle increasing plate receives first light with a first viewing angle from the light conduits forming the inner inclined surface and transmits second light of a second viewing angle larger than the first viewing angle from a second side facing away from the inner inclined surface.

In one embodiment, a first surface is equal to or smaller than a pixel or a sub-pixel of the individual display devices, and the second surface is larger than the first surface.

In one embodiment, second surfaces of first light conduits are larger than second surfaces of second light conduits. The first light conduits are closer to the edge relative to the second surfaces of second light conduits located farther from the edge relative to the first light conduits.

In one embodiment, the portion of the frame section is further defined by a top surface extending over at least a non-display area of the individual display device and facing away from the individual display device, the inner inclined surface and the outer inclined surface between the top surface and the bottom surface.

In one embodiment, each of the light conduits and the cladding portions are surrounded by supporting material having a third refractive index lower than the first refractive index and the second refractive index.

In one embodiment, the optical member further comprises a light-transmitting layer between the frame section and another frame section.

In one embodiment, each of the light conduits has a cross section shape of a convex polygon.

In one embodiment, the multi-panel display device further includes a viewing angle increasing plate on the frame section of the optical member at a side of the frame section opposite to the plurality of adjoining individual display devices. The viewing angle increasing plate receives first light with a first viewing angle from the light conduits at a first side facing the light conduits and transmits second light of a second viewing angle larger than the first viewing angle from a second side facing away from the light conduits.

In one embodiment, the viewing angle increasing plate includes a set of light conduits of a third refractive index and support parts fixing the plurality of light conduits. The support parts have a fourth refractive index higher than the third refractive index.

In one embodiment, the set of light conduits includes optical fibers of a same diameter.

In one embodiment, the diameter of each of the optical fibers is less than 50% or more than 200% of a diameter of each of the plurality of light conduits.

In one embodiment, the first side and the second side of the viewing angle increasing plate are parallel.

In one embodiment, the viewing angle increasing plate has a thickness of 0.1 mm to 3 mm.

Embodiments also relate to an optical member for a multi-panel display device. The optical member includes a first frame section covering junction areas of first and second individual display devices where images are not displayed and portions of display areas of the first and second individual display devices adjacent to the junction areas. The first frame section comprises a plurality of light conduits of a first refractive index and cladding portions of a second refractive index lower than the first refractive index. The cladding portions surround the plurality of light conduits.

In one embodiment, the optical member further includes a second frame section connected to the first frame section. The second frame section covers junction areas of the first individual display device and a third individual display device adjacent to the first individual display device.

In one embodiment, each of the light conduits comprises: a first surface configured to receive light from the covered display areas; and a second surface facing away from the individual display device.

In one embodiment, a center of the second surface is shifted towards a junction area relative to a center of the first surface, the junction area adjacent to a portion of the frame section that includes each of the light conduits.

In one embodiment, a portion of the first frame section is defined at least by (i) a bottom surface facing a display area of the first individual display device; (ii) an inner inclined surface extending from the bottom surface and facing away from the first individual display device; and (iii) an outer inclined surface extending from the bottom surface, the outer inclined surface extending over a non-display area of the first individual display device and facing a junction area between the first individual display device and the second individual display device.

In one embodiment, a first acute angle between the inner inclined surface and the bottom surface is smaller than a second acute angle between the outer inclined surface and the bottom surface.

In one embodiment, the optical member further includes a refraction compensating member on the inner inclined surface, light received from the inclined surface refracted by the refraction compensation member in a direction perpendicular to surfaces of the individual display devices.

In one embodiment, the refraction compensating member includes a first surface facing the inner inclined surface, and a second surface facing away from the inner inclined surface, the first surface forming an acute angle relative to the second surface.

In one embodiment, the second surface forms another acute angle relative to the surface of the individual display devices.

In one embodiment, the optical member further includes a viewing angle increasing plate between the refraction compensating member and the inner inclined surface. The viewing angle increasing plate receives first light with a first viewing angle from the light conduits forming the inner inclined surface and transmits second light of a second viewing angle larger than the first viewing angle from a second side facing away from the inner inclined surface.

In one embodiment, the portion of the first frame section is further defined by a top surface extending over at least a non-display area of the first individual display device and facing away from the first individual display device, the inner inclined surface and the outer inclined surface between the top surface and the bottom surface.

In one embodiment, each of the light conduits and the cladding portions are surrounded by supporting material having a third refractive index lower than the first refractive index and the second refractive index.

In one embodiment, the optical member further includes a viewing angle increasing plate on the frame section of the optical member at a side of the frame section opposite to the plurality of adjoining individual display devices. The viewing angle increasing plate receives first light with a first viewing angle from the light conduits at a first side facing the light conduits and transmits second light of a second viewing angle larger than the first viewing angle from a second side facing away from the light conduits.

In one embodiment, the viewing angle increasing plate includes a set of light conduits of a third refractive index and support parts fixing the plurality of light conduits. The support parts have a fourth refractive index higher than the third refractive index.

In one embodiment, the set of light conduits comprise optical fibers of a same diameter.

In one embodiment, the diameter of each of the optical fibers is less than 50% or more than 200% of a diameter of each of the plurality of light conduits.

In one embodiment, the first side and the second side are parallel.

In one embodiment, the viewing angle increasing plate has a thickness of 0.1 mm to 3 mm.

Embodiment also relate to a method of manufacturing a frame shaped optical member for placing on a plurality of individual display devices. A plurality of optical fibers are bundled into a block. The block of optical fibers is heated. The block of heated optical fibers are pressed at both sides of the block to shape the block into a portion of the frame shaped optical member so that at least a subset of the optical fibers in the portion have input surfaces of an area smaller than corresponding output surfaces. The input surfaces receive lights from active areas of the display devices and the output surfaces transmit the received light. The optical member is cooled to solidify a shape of the optical member.

Embodiments also relate to a frame-type optical member for a multi-panel display device with a plurality of connected individual display devices. The frame-type optical member has a frame section including a bottom portion covering a portion of an active area of each of the individual display devices, an inner inclined surface that extends upward from the bottom portion at a first angle with respect to surfaces of the individual display device, a top portion that extends parallel to the bottom portion, a first optical fiber having an input end in the bottom portion and an output end in the inner inclined surface, and a second optical fiber having an input end in the bottom portion and an output end in the top portion. The frame-type optical member also includes a first viewing angle increasing plate on the top portion of the frame section. The first viewing angle includes a set of optical fibers configured to receive first light with a first viewing angle from the frame section and transmit second light of a second viewing angle larger than the first viewing angle.

In one embodiment, a diameter of the input end of the first optical fiber is identical to a diameter of the output end of the first optical fiber, and a diameter of the input end of the second optical fiber is smaller than a diameter of the output end of the second optical fiber.

In one embodiment, a diameter of each of the set of optical fibers in the first viewing angle increasing plate differs from the diameter of the input end of the first optical fiber.

In one embodiment, the diameter of each of the optical fibers in the first viewing angle increasing plate is less than 50% or more than 200% of the diameter of the input end of the first optical fiber.

In one embodiment, the first viewing angle increasing plate has a thickness of 0.1 to 3 mm.

In one embodiment, the frame-type optical member includes a refraction compensating member on the inner inclined surface of the frame section to refract light emitted from the first optical fiber of the frame section. Light received from the inclined surface is refracted by the refraction compensation member in a direction perpendicular to surfaces of the individual display devices.

In one embodiment, the frame-type optical member further includes a second viewing angle increasing plate on the inner inclined surface of the frame section. The second viewing angle increasing plate includes another set of optical fibers. The second viewing angle increasing plate receives third light with a third viewing angle from the frame section and transmit fourth light of a fourth viewing angle larger than the third viewing angle.

In one embodiment, the frame-type optical member further includes a refraction compensating member on the second viewing angle increasing plate to refract light emitted from the other set of optical fibers of the second viewing angle increasing plate in a direction perpendicular to surfaces of the individual display devices.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE INVENTION

Figure 1:
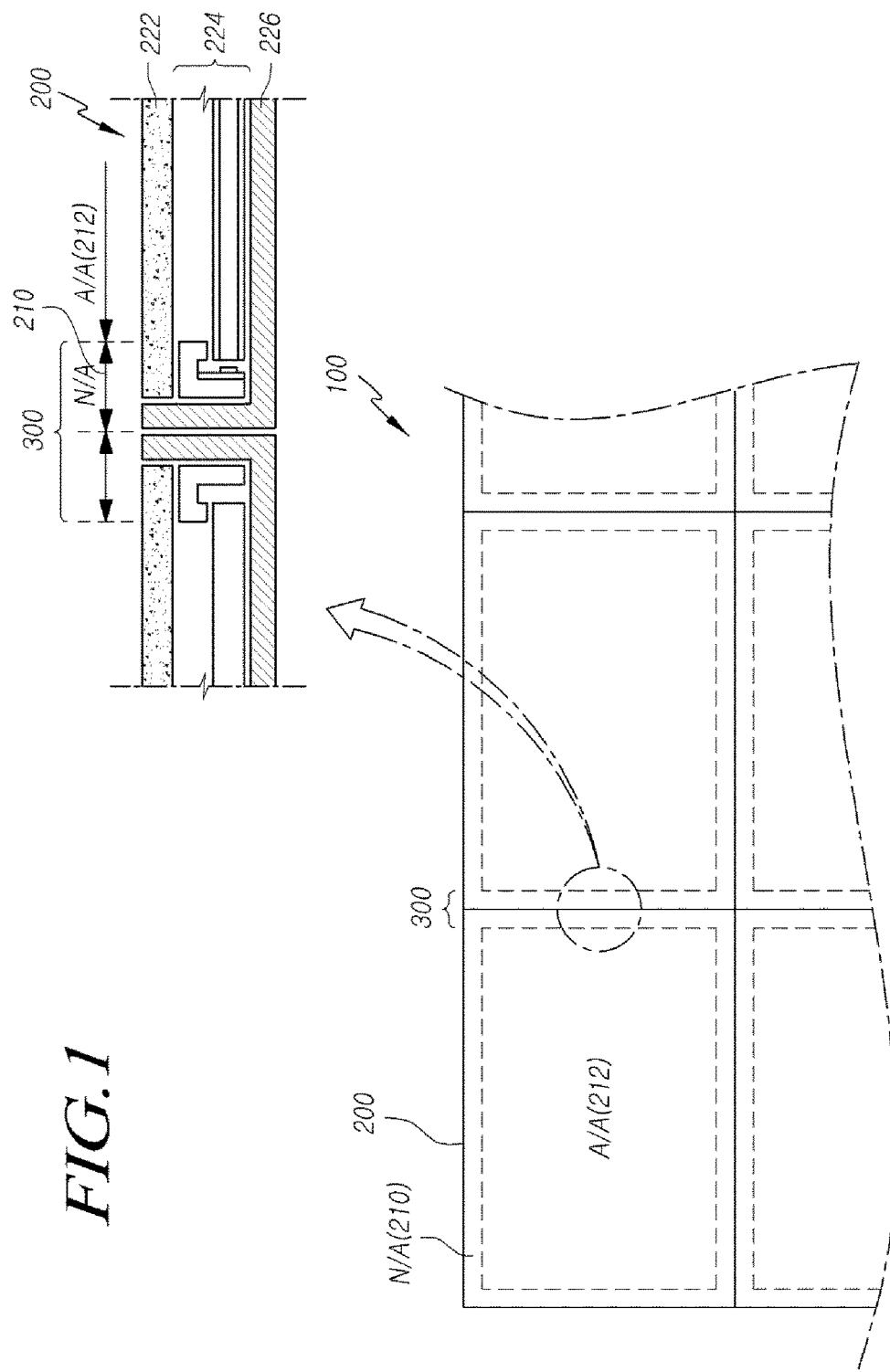
FIG. 1 illustrates a plan view of a multi-panel display device according to an embodiment of the present invention and an enlarged cross-sectional view of a panel junction area of the multi-panel display device.

Hereinafter, some embodiments of the present invention will be described in details with reference to the accompanying drawings. In describing the invention with reference to the accompanying drawings, like elements are referenced by like reference numerals or signs regardless of the drawing numbers. When it is determined that detailed description of known techniques involved in the invention makes the gist of the invention obscure, the detailed description thereof will not be made.

Terms such as first, second, A, B, (a), and (b) can be used to describe elements of the invention. These terms are merely used to distinguish one element from another element and the essence, order, sequence, number, or the like of the elements is not limited to the terms. If it is mentioned that an element is "coupled" or "connected" to another element, it should be understood that the element is directly coupled or connected to another element or still another element is "interposed" therebetween or the elements may be "coupled" or "connected" to each other with still another element interposed therebetween.

FIG. 1 illustrates a multi-panel display device according to an embodiment and illustrates a plan view of the multi-panel display device and an enlarged cross-sectional view of a panel junction area of the multi-panel display device. Referring to FIG. 1, a general multi-panel display device 100 is formed by adjoining plural individual display devices 200. The multi-panel display device 100 includes junction areas 300 where the individual display devices 200 are adjoined.

Each individual display device 200 independently serves as a separate and fully functional display device and can be embodied, for example, as a liquid crystal display device (LCD), an organic light-emitting display device (OLED), or the like.

An individual display device described herein refers to a single display device constituting a multi-panel display device and may also be referred to herein as an individual panel or a panel.

As illustrated in FIG. 1, each individual display device 200 includes an active area (A/A) 212 which refers to the center of a panel and in which an image is displayed, and a non-active area (N/A) 210 which refers to the edge of the panel surrounding the active area and in which an image is not displayed. The non-active area 210 of the individual display device 200 is also referred to as a bezel area.

On the other hand, each individual display device 200 may include a display panel 222, a backlight unit 224 that is disposed below the display panel to supply light to the display panel, and a support structure 226 that surrounds the entire display device.

The display panel 222 is manufactured by bonding a first substrate which is an array substrate. Thin film transistors and the like are formed in the first substrate. A pixel area is defined in a second substrate which is an upper substrate formed with a black matrix and/or a color filter layer and the like. In case of a panel based on an OLED display device, the second substrate may serve as only a protective substrate.

The backlight units 224 may include subunits such as a light source module including a light source such as an LED, a holder fixing the light source, and a light source driving circuit, a light guide plate (LGP) or a diffusion plate that diffuses light to the entire panel area, a reflective plate that reflects light to the display panel, an LED flexible circuit which is a circuit for controlling ON/OFF of the light source and the like, and one or more optical films or sheets that are disposed on the light guide plate for improvement in luminance, diffusion of light, protection, and the like.

An outer support member 226 covering the display device may be a cover bottom and/or a guide panel surrounding and protecting the backlight unit 224 and the display panel 222 as a unit of each display device, a back cover as a unit of a set electronic device which is a final electronic product including display devices, or the like.

On the other hand, as illustrated in FIG. 1, each individual display device 200 includes a non-active area (N/A) 210 at its predetermined edge area where images are not displayed. Since the multi-panel display device is formed by joining plural individual display devices 200, an image is not displayed in junction areas 300 in which the individual display devices are joined in the multiple display panels.

On the other hand, the non-active area (N/A) 210 of each individual display device 200 can be formed by a non-active area of the display panel 222 itself, an area covered by the backlight unit 224 or the like, a case top or a front cover covering the entire surface of the display device, and the like.

Therefore, when a signal image is displayed on the multi-panel display device or the video wall illustrated in FIG. 1, image discontinuity in which an image is not displayed occurs in the junction areas 300.

Figure 2:
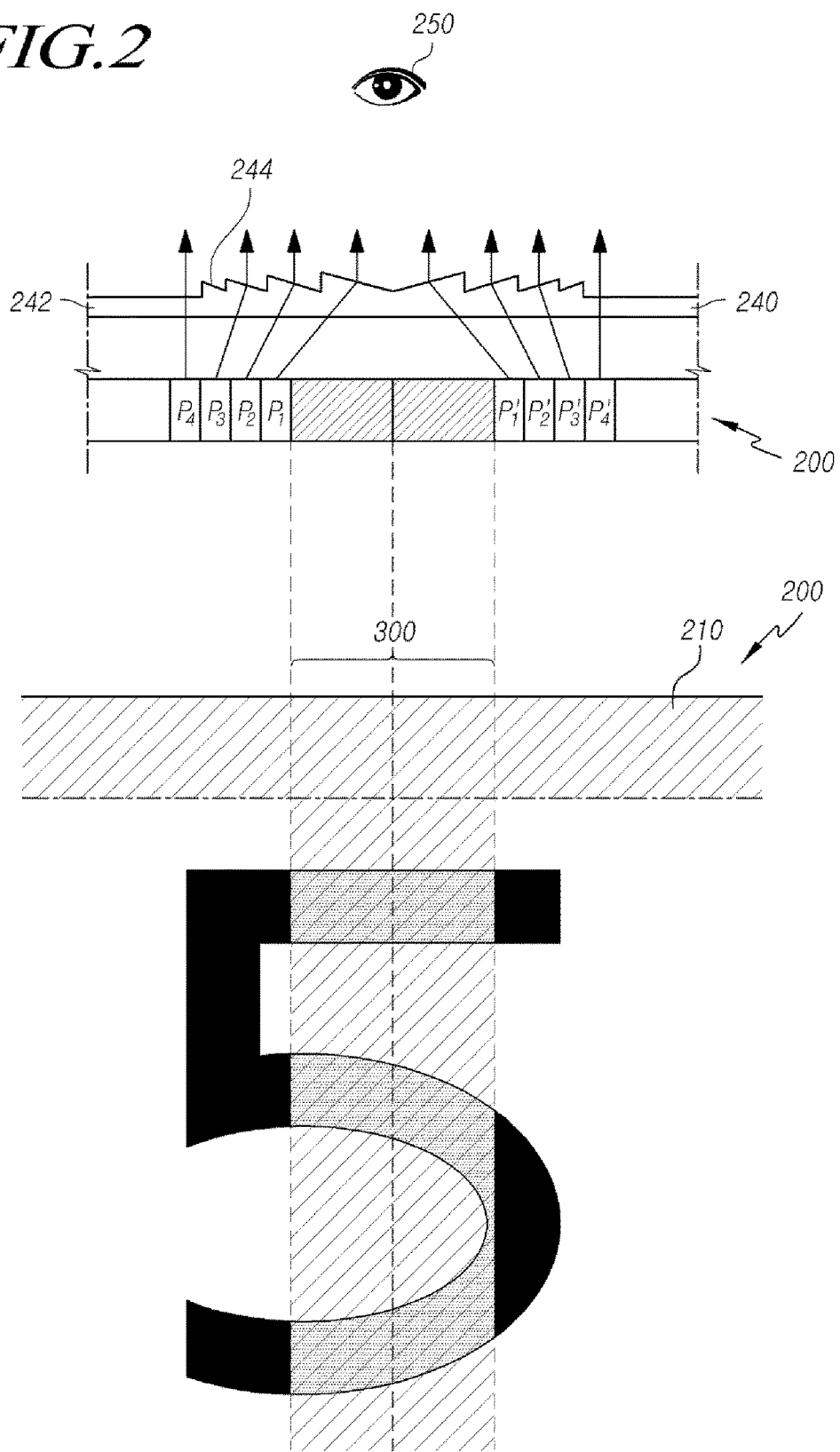
FIG. 2 is a diagram illustrating image discontinuity occurring in junction areas of individual display devices of a multi-panel display device according to the related art.

FIG. 2 illustrates an example of a refractive optical member that enlarges and displays the junction areas of the multi-panel display device and an image in the front viewing field when the refractive optical member is used. As illustrated in FIG. 2, one way of solving the phenomenon of image discontinuity in the junction areas of the multi-panel display device is to use a technique where a refractive optical member is disposed on the multi-panel display device so as to refract or enlarge an optical path in the vicinity of the junction areas.

FIG. 2 illustrates a configuration in which a lens plate disposed on the multi-panel display device is used as such a refractive optical member. The lens plate 240 which is the refractive optical member illustrated in FIG. 2 is a type of light-transmitting screen and includes a base plate 242 which is a general light-transmitting panel material having a predetermined thickness and a lens unit formed in the vicinity of the junction area 300 of the multi-panel display device.

The lens unit 244 formed in the lens plate 240 is used to refract an optical path in the vicinity of the junction area 300 and a Fresnel lens or the like can be used, but the lens unit is not limited to the Fresnel lens.

When a user is placed in front of the junction area 300 as illustrated in FIG. 2, light from pixels P1 to P4 in the neighboring active area is refracted and is incident on the user's viewing field by the lens unit 244 of the lens plate 240 formed on the junction areas of the multi-panel display device. When a user watches the multi-panel display device from the front side, images of neighboring pixels are refracted and projected to the junction areas 300 to display a predetermined image as illustrated in the lower part of FIG. 2. Accordingly, the image discontinuity in the panel junction area is compensated for to a certain extent.

Figure 3:
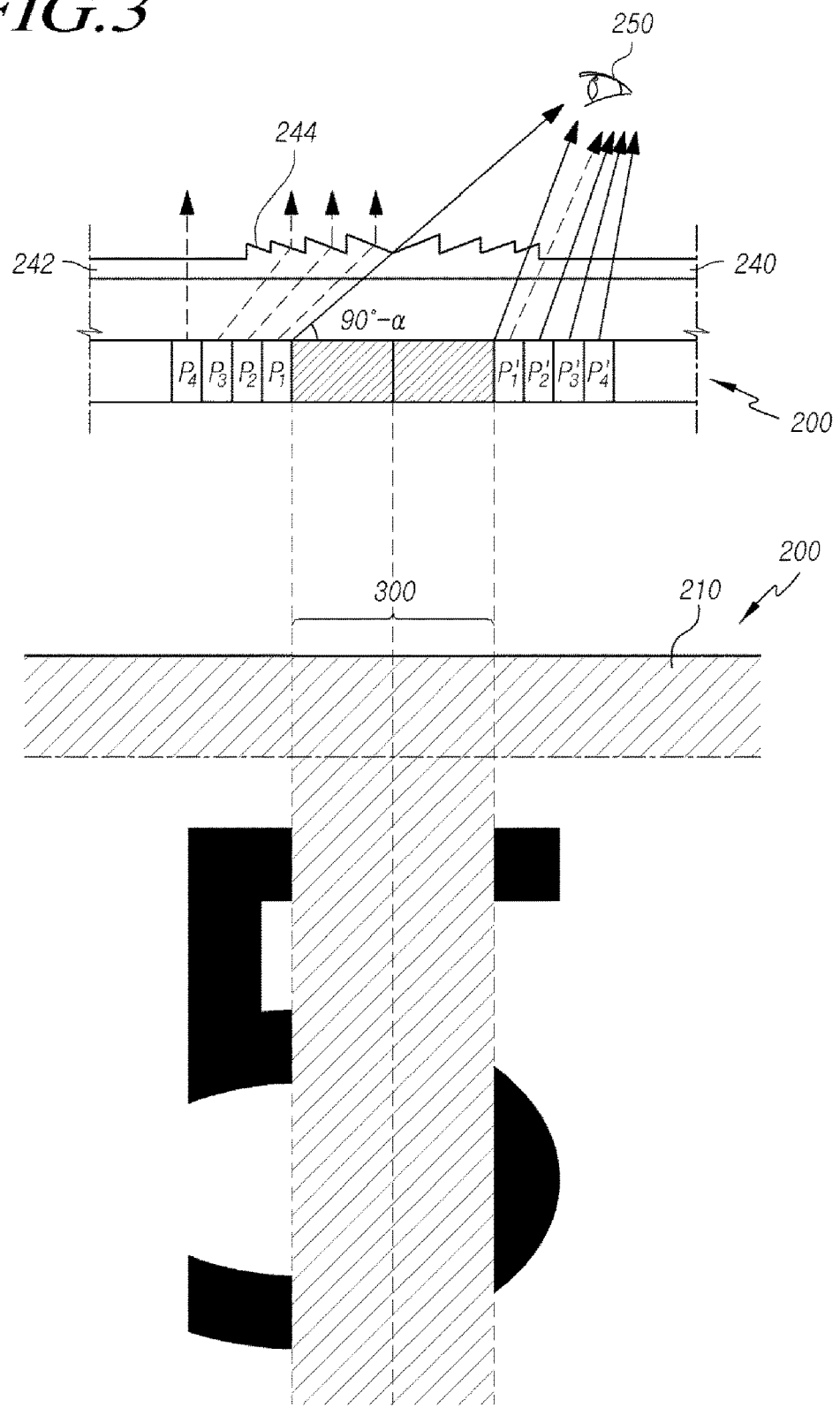
FIG. 3 is a diagram illustrating image discontinuity occurring in the refractive optical member of FIG. 2 when a viewing angle is equal to or greater than a predetermined angle.

In these attempts using Fresnel lens plate, to solve image discontinuity in the panel junction area is advantageously prevented when viewed from the front. However, when a user's viewing angle departs from the front side (with a viewing angle of 0 degrees) and is equal to or greater than about 45 degrees ($\alpha$), the optical path illustrated in FIG. 2 is not formed and the panel junction area 300 is exposed. That is, as illustrated in FIG. 3, when the viewing angle is $\alpha$ ($\alpha$>about 45 degrees), some light from the pixels in the vicinity of the junction area is not incident on a user obliquely watching the multi-panel display device and thus bezels of the individual display devices are exposed. Therefore, the phenomenon of image discontinuity in the panel junction area occurs as illustrated in the lower part of FIG. 3.

Embodiments of the present invention are proposed to compensate for the phenomenon of image discontinuity occurring in the junction areas of the multi-panel display device even at a viewing angle equal to or greater than a predetermined angle.

In the embodiments of the present invention, in order to provide a seamless image in the junction areas of the individual display devices at a front viewing angle and a high viewing angle in a multi-panel display device in which plural individual display devices are joined, a frame-type optical member including plural optical fibers and resin supports supporting the optical fibers is disposed on the multi-panel display device to output an image to the non-active area via output ends of the optical fibers.

Particularly, the frame-type optical member includes an inner inclined surface on which the output ends of the optical fibers are arranged and an outer inclined surface that covers the non-active area (bezel area) of the individual display device and can provide a continuous image in the junction area of the individual display devices constituting the multi-panel display device by using a frame-type optical member including optical fibers to output an image to the non-active area via output ends of the optical fibers.

Hereinafter, detailed configurations of a frame-type optical member according to the embodiments of the present invention and the multi-panel display device having the frame-type optical member will be described with reference to FIG. 4A through FIG. 11B.

Figure 4A:
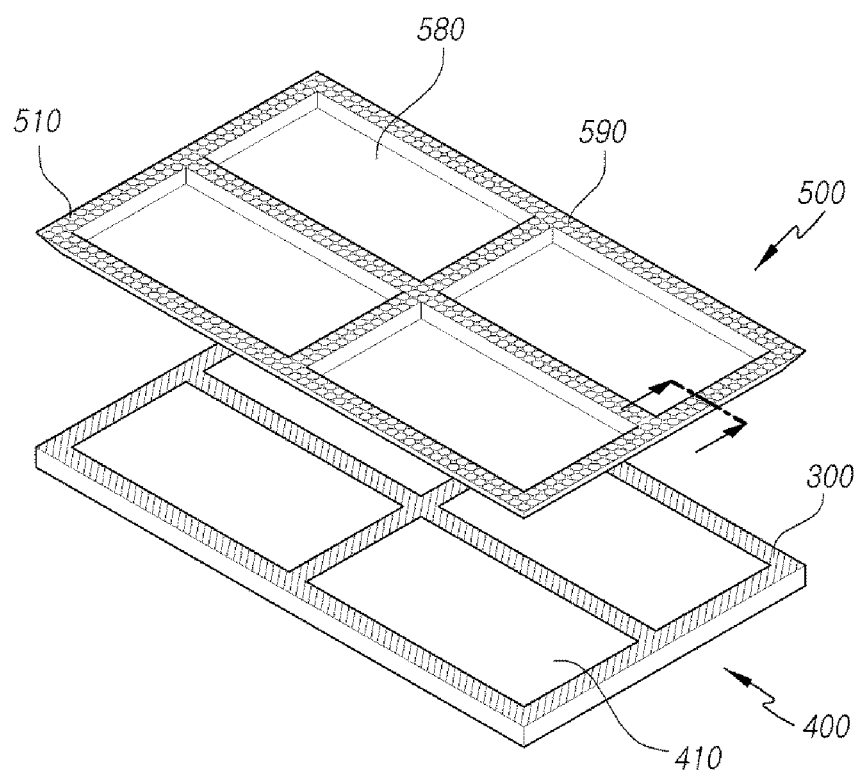
FIG. 4A is a perspective view of a multi-panel display device including a frame-type optical member, according to one embodiment of the present invention.
Figure 4B:
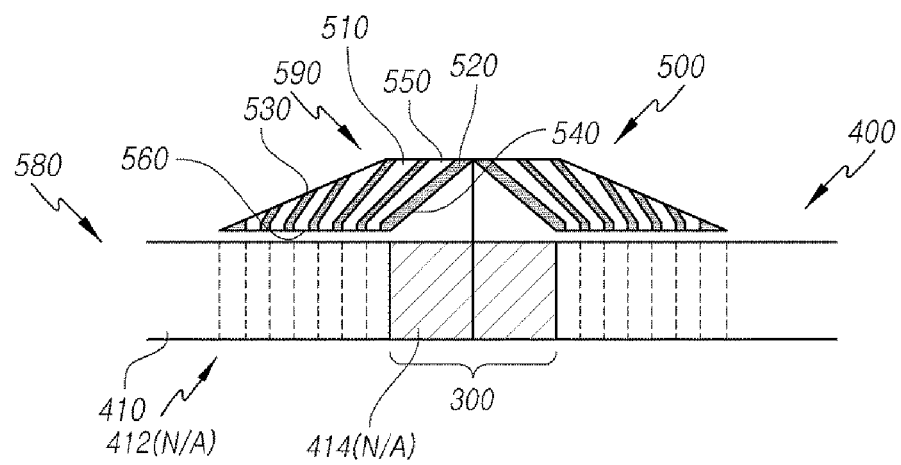
FIG. 4B is a schematic cross-sectional view of a multi-panel display device including a frame-type optical member, according to one embodiment of the present invention.

FIG. 4A is a perspective view of a multi-panel display device including a frame-type optical member 500, according to one embodiment of the present invention. FIG. 4B is a schematic cross-sectional view of a multi-panel display device including a frame-type optical member 500, according to one embodiment of the present invention.

As illustrated in FIGS. 4A and 4B, a multi-panel display device according to an embodiment of the present invention may include a display panel section 400 that is formed by joining plural individual display devices and includes junction areas in which non-active areas of the individual display devices are joined, and a frame-type optical member 500 that includes light conduits (e.g., plural optical fibers 510) and a resin support 520 which is disposed between the optical fibers and supports and bind the optical fibers.

The frame-type optical member 500 includes light-transmitting central areas 580 and a frame section 590 surrounding the central areas. The frame section 590 covers the non-active areas or bezel areas of the individual display devices 410 and a part of edges of the active areas of the individual display devices.

That is, as illustrated in FIGS. 4A and 4B, the frame-type optical member 500 according to this embodiment has frames that cover the entire top areas of the junction areas 300 of the multi-panel display device disposed in a lattice shape and has openings corresponding to the central areas of the individual display device.

The frame section 590 of the frame-type optical member 500 includes a plurality of optical fibers 510 and resin support 520 that are disposed between the optical fibers 510. The optical fibers 510 receive light from pixels disposed at the edge of the active area of an individual display device and output the received light at the top of the frame-type optical member. The resin support 520 binds and supports the optical fibers 510.

The frame section 590 of the frame-type optical member 500 includes a bottom portion 560 covering a part of an edge of an active area of an individual display device and an inner inclined surface 530 extending from the bottom portion at a first angle $\theta 1$ with respect to the display panel section.

In addition to the bottom portion 560 and the inner inclined surface 530, the frame section 590 of the frame-type optical member 500 further includes an outer inclined surface 540 that is disposed on the non-active area of the individual display device and has a second angle ($\theta 2$) with the display panel section, and top portion 550 that extends in a direction parallel to the bottom portion 560 between the inner inclined surface 530 and the outer inclined surface 540.

Accordingly, as illustrated in 4B, a cross-section of the frame section 590 of the frame-type optical member 500 according to this embodiment has a twisted quadrangular shape.

Figure 11A:
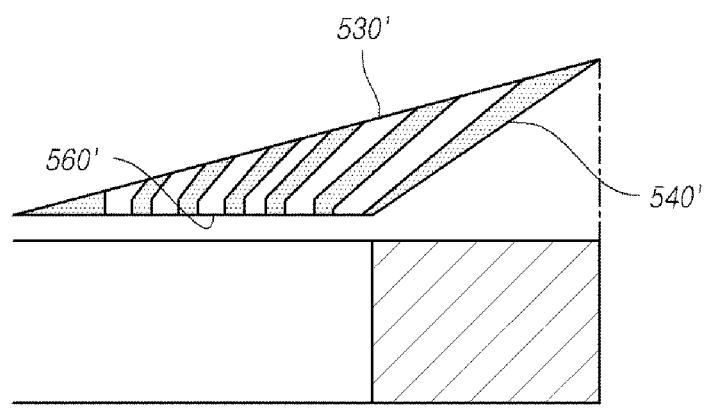
FIGS. 11A and 11B are cross-sectional views illustrating examples of a sectional shape of the frame section of the frame-type optical member.
Figure 11B:
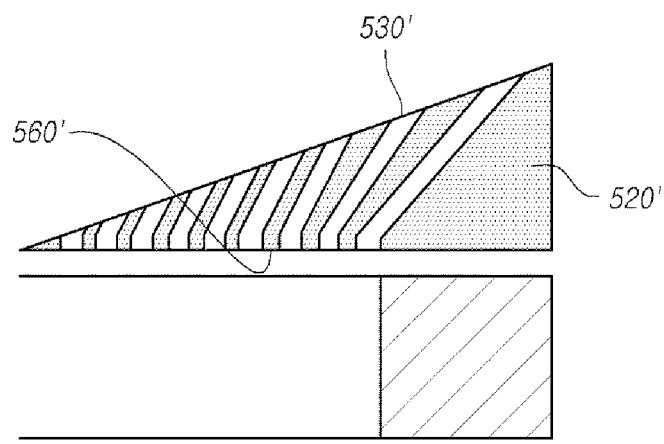

However, the cross-section of the frame section 590 of the frame-type optical member is not limited to the twisted quadrangular, and may be a right triangular shape that is formed by an inner inclined surface 530' and a bottom portion 560' or be a triangular shape that is formed by the inner surface 530', the bottom portion 560', and an outer inclined surface 540' without a top portion, as illustrated in FIGS. 11A and 11B.

Further, plural optical fibers 510 are disposed in the frame section 590 of the frame-type optical member according to this embodiment. Each optical fiber has an input end opened to the bottom portion 560 of the frame section and an output end opened to the inner inclined surface 530 of the frame section.

The input end of the optical fiber 510 faces a pixel or a sub-pixel arranged in an edge of the active area 412 of the individual display device 410. The input end may have a size equal to or smaller than the size of the corresponding pixel or sub-pixel.

Each optical fiber 510 receives light from the corresponding pixel and transmits the light to the top portion of the inner inclined surface 530 of the frame-type optical member by total internal reflection.

As described herein, the bottom part or the bottom portion of the frame-type optical device is a surface facing the display panel section 400, and the top part or the inner inclined surface of the frame-type optical device is an image display surface in which images are output via the optical fibers.

The display panel section 400 of the multi-panel display device according to the embodiments of the present invention corresponds to a display unit of a multi-panel display device that displays an image by joining individual display devices 410. In boundary areas where the individual display devices are joined, bezel areas or non-active areas (NA) 414 of the individual display device are joined to form areas in which images are not displayed. As described herein, boundary areas where the individual display devices join are referred to as junction areas 300.

Therefore, the junction areas 300 of the multi-panel display device are non-active areas that are formed in the shape of the lattice in the entire multi-panel display device, and the width of each junction area 300 is double the width of the non-active area 414 of each individual display device 410.

In these junction areas 300, image discontinuity occurs. As will be described below, in order to solve the problem, this embodiment is conceived to output images transmitted from the pixels of an active area to the top area of an optical member via some of optical fibers included in a frame-type optical member. The top area includes areas which correspond to the junction areas. A detailed configuration of this optical fiber and a solution principle of the image discontinuity phenomenon will be described in detail as follows.

An individual display device 410 which can be used with the present invention may be a liquid crystal display device, but is not limited thereto, and include all forms of display device such as a plasma display device (PDP), an organic light emitting diode (OLED) display device, and the like.

Further, the individual display device 410 that is applied in the embodiment of the present invention may include a display panel in which pixels are formed, and a panel support structure such as a cover bottom, the panel support structure supporting the display panel. The individual display device 410 may be a module that is comprised of only a simple display panel and a driving circuit for driving the display panel, and the support structure such as a case may be formed with the entire multi-panel display device as a unit.

That is, the individual display device as described herein serves as a complete and independent display device, and may include a display panel that includes an array substrate, a upper substrate, and a display material layer (liquid crystal material, organic light emitting material or the like) which is disposed between the array substrate and the upper substrate, a driving circuit unit for driving the display panel, and the like, but may not include the support structure such as a bottom cover.

When the individual display device 410 is a liquid crystal display device, the display panel is a liquid crystal panel, and may further include a backlight unit that is arranged in the lower part of the liquid crystal panel and supplies light to the liquid crystal panel.

On the other hand, when the individual display device 410 is also a liquid crystal display device, the liquid crystal display panel may include an array substrate that includes multiple gate lines, multiple data lines, multiple pixels defined by areas in which the gate lines and the data lines are crossed, and a thin film transistor TFT that serves as a switching device for controlling light transmittance in each pixel, a upper substrate that includes a color filter and/or black matrix and the like, and a liquid crystal material layer that is formed between the array substrate and the upper substrate. A touch window may be further arranged on the entire top surface of the display panel.

When the individual display device applied with the embodiments of the present invention is an organic light emitting diode (OLED) display device, the display panel may be comprised of an array substrate and a upper protective substrate, the array substrate including gate lines, data lines, pixels defined by areas in which the gate lines and the data lines are crossed, and a thin film transistor TFT which serves a switching device for selectively applying electric signals to an organic field emission material layer.

Further, the frame-type optical member 500 includes the resin support 520 that is arranged between plural optical fibers to support and bind the optical fibers, wherein the resin support 520 may be made of thermosetting resins or UV curing resins.

Accordingly, the frame-type optical member 500 according to this embodiment can be formed by arranging optical fibers 510 having a shape, filling spaces between the optical fibers with a resin material, and then curing the resin material by using heat or ultraviolet (UV).

This resin support 520 may be formed by using a light-transmitting resin material, but is not limited thereto. Further, the refractive index of the resin material of the resin support 520 may be smaller than refractive indexes of optical fiber materials of the optical fibers 510.

Figure 5A:
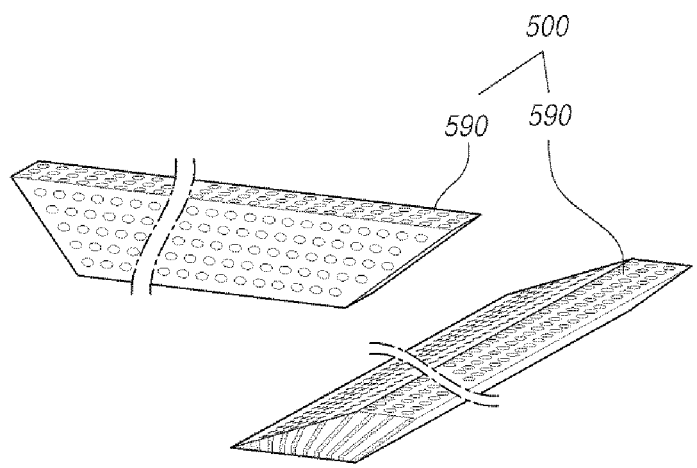
FIGS. 5A and 5B are enlarged perspective views of the frame-type optical member according to one embodiment of the present invention.
Figure 5B:
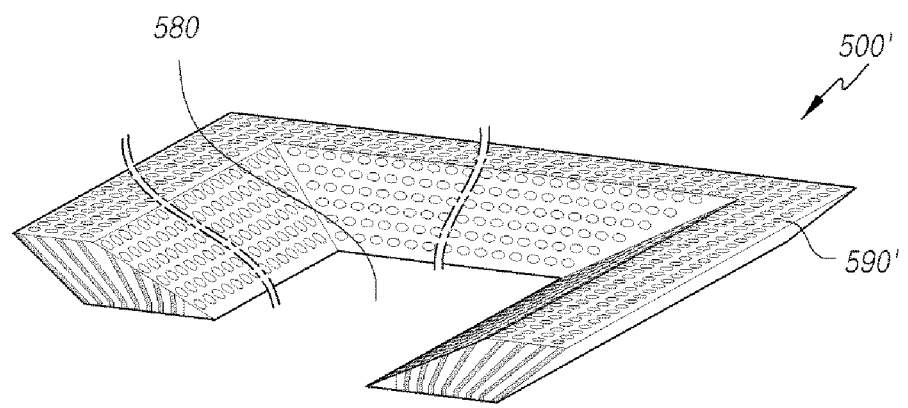

FIGS. 5A and 5B are enlarged perspective views of the frame-type optical member according to the embodiments of the present invention.

As illustrated in FIG. 5B, the frame-type optical member according to the embodiments of the present invention may be formed by joining multiple frame sections 590 which cover the junction areas of the multi-panel display device as a single lattice configuration, but is not limited thereto. That is, as illustrated in FIG. 5A, each frame section 590 may be independently formed and then arranged on the corresponding area of the multi-panel display device.

In both the case of FIG. 5A and the case of FIG. 5B, when the frame-type optical member is disposed on the multi-panel display device, the frame-type optical member includes a central area 580 that transmits images of the center of the active area of the individual display device as is, and frame sections 590 that are arranged to surround the central area 580 and transfer image of pixels of the edge of the active area to the junction area via internal optical fibers.

Figure 6:
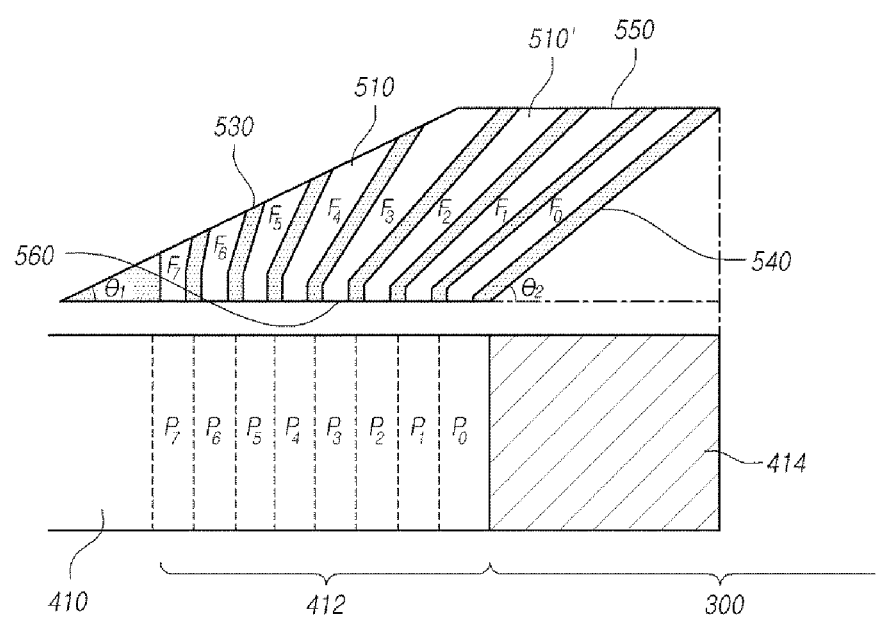
FIG. 6 is an enlarged cross-sectional view of a frame section of the frame-type optical member according to one embodiment of the present invention.

FIG. 6 is an enlarged cross-sectional view of a frame section of the frame-type optical member according to the embodiment of the present invention. As illustrated in FIG. 6, multiple optical fibers 510 are arranged in a frame section of a frame-type optical member and input ends of the optical fibers, the input ends being opened to a bottom portion 560 of the frame section, are arranged just on pixels P7 to P0 in the edge of the active area 412 of the individual display device 410 to receive light from the corresponding pixels.

For example, eight optical fibers F7 to F0 are arranged to correspond to pixels P7 to P0 from most inner side of the frame section respectively, and input end of each optical fiber is arranged just on a corresponding pixel.

An output end of the each optical fiber F7 to F0 is arranged in an inner inclined surface 530 of the frame section of the frame-type optical member to output lights of the corresponding pixels, which are received via the input ends and totally reflected in the optical fiber, to outside. As a result, images are focused on the inner inclined surface 530 of the frame-type optical member.

Further, as illustrated in FIG. 6, since some of the output ends of the optical fiber 510 are arranged on at least one of the non-active areas of the individual display device and the junction area of the multi-panel display device, image of the pixels of the active area is outputted on the junction area of the multi-panel display device, such that image discontinuity in the junction area of the multi-panel display device does not occur.

Figure 7A:
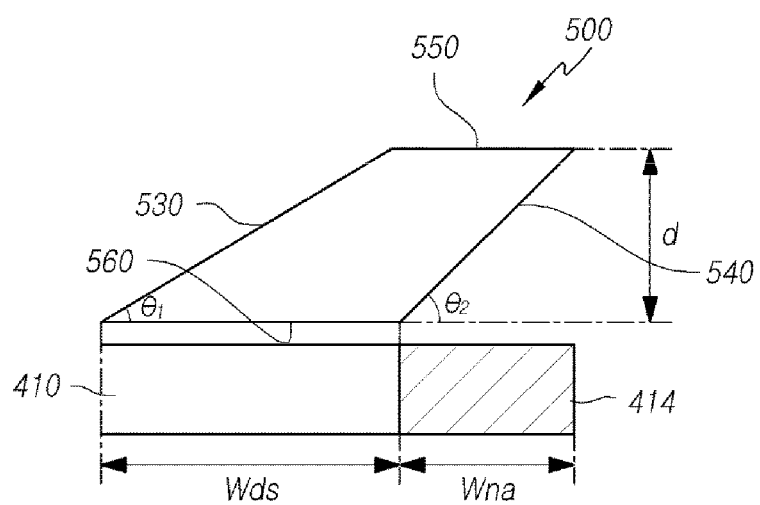
FIGS. 7A and 7B are enlarged cross-sectional views of a frame section of the frame-type optical member according to one embodiment of the present invention.
Figure 7B:
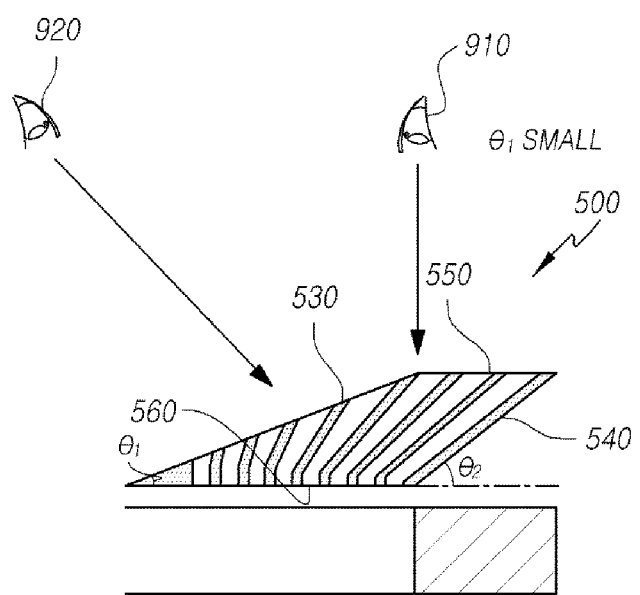

FIGS. 7A and 7B are enlarged cross-sectional views of a frame section of the frame-type optical member according to the embodiment of the present invention, where a relationship between an outer incline surface 540 and an inner inclined surface 530 is illustrated.

In a frame section of a frame-type optical member according to the embodiments of FIGS. 7A and 7B, an outer inclined surface 540 arranged on a non-active area 414 of the individual display device is provided in addition to an inner inclined surface 530 in which output ends of optical fibers are arranged. Further, the frame section having a rectangular sectional shape may further include a top portion 550 at an opposite side of the bottom portion.

In order to reduce weight of the frame-type optical member, space under the outer inclined surface 540 may be empty. A first angle θ1 formed by the inner inclined surface 530 and the display panel section is smaller than a second angle θ2 formed by the outer inclined surface 540 and the display panel section 400.

Therefore, like FIG. 7A, the width Wds of the bottom portion of the frame section of the frame-type optical member becomes larger than the width Wna of the non-active area of the individual display device, the width Wna being the length of a projection of the outer inclined surface.

Further, the first angle θ1 which is an acute angle formed by inner inclined surface 530 and the display panel section may be in the ranges from 10 degrees to 20 degrees.

Figure 8A:
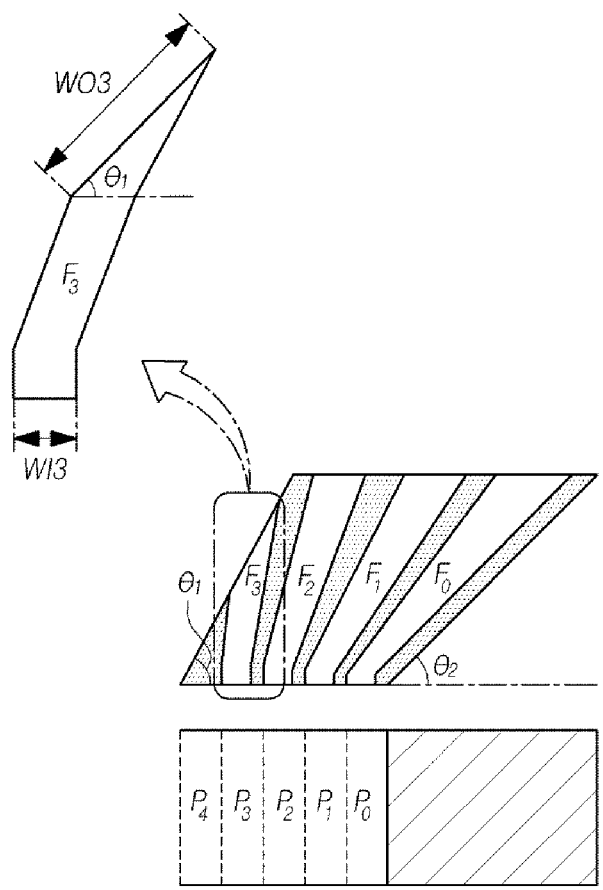
FIGS. 8A and 8B are cross-sectional views illustrating difference in viewing depending on of the magnitude of a first angle (θ1) of the inner inclined surface of the frame-type optical member, according to one embodiment of the present invention.
Figure 8B:
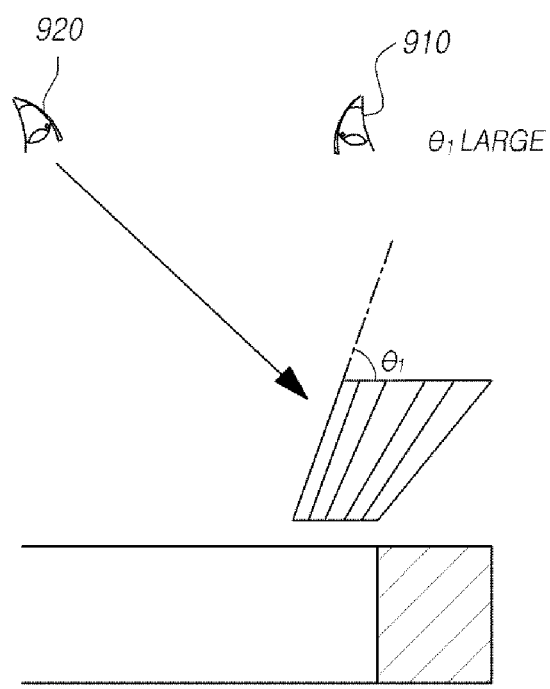

FIGS. 8A and 8B are cross-sectional views illustrating the effect of the magnitude of a first angle (θ1) of the inner inclined surface of the frame-type optical member. As illustrated in FIG. 8A, when the first angle θ1 of the frame-type optical member increases, the size of the output ends of the optical fiber increases depending on the first angle. That is, referring to the third optical fiber F3 of FIG. 8A as an example, when the first angle is θ1 (θ1>0), the size WO3 of the output end of the optical fiber F3 is 1/cos θ1 times larger than that of a case that the first angle is 0 degree when the output end of the optical fiber F3 is parallel to the bottom portion.

As a result, when the first angle θ1 is 60 degrees, the size of the output end of the optical fiber is doubled relative to the case when the first angle θ1 is 0 degree.

On the other hand, since a ratio of the size WOi of the output end relative to the size WIi of the input end corresponds to a magnification ratio of image magnified by the corresponding optical fiber, as described above, when the first angle θ1 increases, the magnification power of an image outputted to the inner inclined surface also increases.

Referring to FIG. 8A as an example, an image of the pixel P4 that is arranged to correspond to the most edge of the central area is output as is without magnification via the central area of the frame-type optical member, but an image of the pixel P3 that is just adjacent to the pixel P4 is magnified by 1/cos θ1 and then focused on the inner inclined surface.

Since an image is rapidly increased in terms of size in the inner inclined surface of the frame-type optical member when the first angle θ1 of the inner inclined surface 530 increases, it is impossible to display a continuous image.

Moreover, when the first angle θ1 of the inner inclined surface 530 increases, the inner inclined surface is not acknowledged by an observer 910 from front viewing field, but the inner inclined surface may itself be acknowledged as a new image discontinuity line by an observer 920 from side viewing field.

On the other hand, as illustrated in FIG. 7B, when the first angle θ1 of the inner inclined surface 530 decreases, as described above, images are magnified in the inner inclined surface, and thus seamless image can be displayed to all of the observer 910 from front viewing angle and the observer 920 from side viewing angle. For this reason, the angle of the inner inclined surface 530 included in the frame section of the frame-type optical member may be 20 degrees or less.

On the other hand, when the first angle θ1 of the inner inclined surface decreases, above-mentioned problem can be solved. However, the frame section has a predetermined thickness d, so that the width Wds of the bottom portion which extends toward inside of the active area is greatly widened.

When the first angle θ1 of the inner inclined surface decreases and thus the width Wds of the bottom portion 560 of the frame section is widened, the size of the entire frame-type optical member increases as a whole and the number of the optical fibers to be included therein increases.

According to this embodiment, when the first angle of the inner inclined surface of the frame section constituting the frame-type optical member is set to be smaller than the second angle of the outer inclined surface and the first angle of the inner inclined surface ranges from about 10 degrees to about 20 degrees, it is possible to display natural images in the junction area of the multi-panel display device while properly maintaining the size of the optical member.

According to actual test results, when the width Wna of the non-active area of the individual display device is about 4 mm, the width Wds of the bottom portion of the frame section may range from about 40 to about 50 mm.

On the other hand, all the sizes WIi of the input ends of the optical fibers 510 arranged in the frame section of the frame-type optical member may have a size corresponding to the pixels of the individual display device and be equal to each other, but the sizes WOi of the output ends of the optical fibers 510 are equal to or larger than the sizes of the input ends, which will be described with reference to FIGS. 9 and 10.

Figure 9:
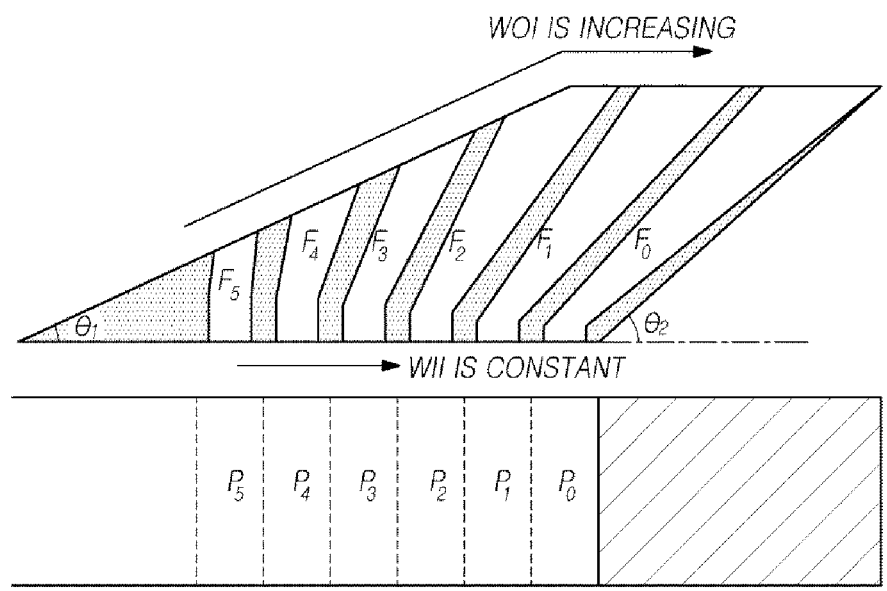
FIG. 9 is a cross-sectional view illustrating the sizes and arrangement of input ends and output ends of optical fibers according to a first embodiment of the present invention.
Figure 9:
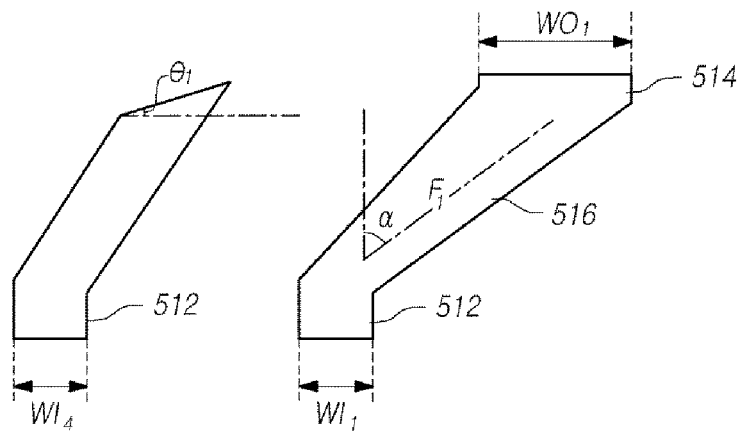

FIG. 9 is a cross-sectional view illustrating the sizes and arrangement of input ends and output ends of optical fibers according to a first embodiment of the present invention. In the first embodiment illustrated in FIG. 9, input ends of the optical fibers F0 to F5 arranged in the frame section of the frame-type optical member correspond to the pixels arranged in the active area of the individual display device and the sizes of the input ends WI0 to WI5 of the optical fibers F0 to F5 are equal to each other, but the sizes of the output ends of the optical fibers F0 to F5 is larger than the size WIi of the input ends and gradually increase toward the edge of the individual display device.

That is, though the sizes WI0 to WI5 of the input ends of the optical fibers F0 to F5 of FIG. 9 are equal to each other, the WO5 of the output end of the optical fiber F5 at the innermost part of the frame section has the smallest size. The size of the output ends gradually increase toward the edge.

Therefore, according to the first embodiment of FIG. 9, the size relationship of the input ends and the output ends of the optical fibers arranged in the frame section of the frame-type optical member 500 can be represented as a mathematical expression 1 as following:

$$WI < WO4 < WO3 < WO2 < WO1 < WO0 \quad \text{[Mathematical Expression 1]}$$

In the first embodiment of FIG. 9, images of pixels of the edge area of the active area of the individual display device are gradually increased towards the edge in the frame section of the frame-type optical member 500. The increase rate of sizes of the output ends of the optical fibers 510 can be determined based on the size of the non-active area of the individual display device, the thickness of the frame-type optical member and the like. However, the size of the largest output end (that is, the size of the optical fiber arranged in the most outside of the individual display device) may be smaller than triple the size of the input end.

According to the first embodiment of FIG. 9, image magnification power of the junction area of the multi-panel display device continuously increases, so that a continuous seamless image can be displayed.

Figure 10:
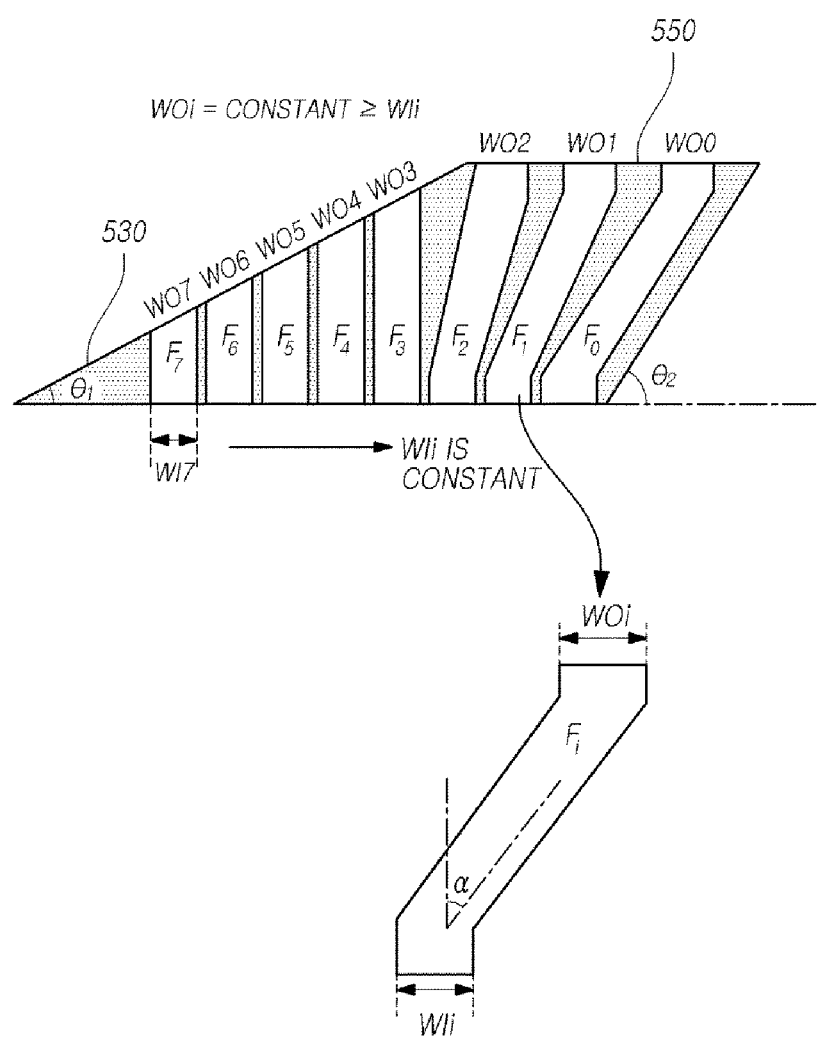
FIG. 10 is a cross-sectional view illustrating the sizes and arrangement of input ends and output ends of optical fibers according to a second embodiment of the present invention.

FIG. 10 is a cross-sectional view illustrating the sizes and arrangement of input ends and output ends of the optical fibers according to a second embodiment of the present invention. The embodiment illustrated in FIG. 10 is similar to the first embodiment of FIG. 9 in that the sizes WI0' to WI7' of the input ends of the optical fibers are equal to each other, but is different from the first embodiment in that the sizes WOi of the output ends of the optical fibers are larger than or equal to the size WIi of the input ends and all the sizes of the optical fibers are equal to each other.

That is, referring to FIG. 10, the sizes WI0 to WI7 of the input ends of the optical fibers F0 to F7 have the same value, and the sizes WO0 to WO7 of the output ends of the optical fibers F0 to F7 are equal to each other. Here, the size WOi of the output ends of all the optical fibers are equal to or larger than the sizes WIi of the input ends.

Accordingly, in the second embodiment of FIG. 10, the size relationship of the input ends and the output ends of the optical fiber 510 arranged in the frame-section of the frame-type optical member 500 can be represented as a mathematical expression 2 as following:

$$WI < WO4 = WO3 = WO2 = WO1 = WO0 \quad \text{[Mathematical Expression 2]}$$

In the second embodiment described above, magnification ratios of images are equal to each other in the inner inclined surface or the top portion of the frame-type optical member 500. Accordingly, compared to the first embodiment in which magnification powers gradually increase depending on the image type, more natural seamless image can be provided.

Like the second embodiment, when images are supplied over the non-active area by the same magnification ratio, images are not distorted because magnification ratios gradually increase toward the edge of individual display device.

Particularly, when the sizes WOi of the output ends of all the optical fibers are equal to the size WIi of the input end, even though resin support areas that are spaces between the output ends WOi of the optical fibers increase toward the edge, an image distortion due to an image magnification by the optical fiber can be minimized in that an image of a pixel is transferred as it is.

That is, according to the second embodiment, though image of the pixel arranged in the edge of the individual display device is transferred to a broader area as is without magnification and thus resolution may be decreased, when an individual display device has an enough resolution, with minimizing the image distortion due to magnification, seamless images can be provided.

Further, in embodiments of the present invention, regardless of the size relationship of the input ends and the output ends of the optical fibers 510 arranged in the frame section of the frame-type display device, a transfer line 516 (FIG. 9) between the input end and the output end is bent at an angle and makes an angle α of inclination from the direction A of the normal line of the display panel.

Here, the optical fibers 510 are arranged so that the optical fibers closer to the edge of the frame-type optical member have greater angle α of inclination formed by the transfer line of the optical fiber and the direction A of the normal line of the display panel.

Therefore, as illustrated in FIG. 6, the optical fibers 510 arranged in the frame section 590 of the frame-type optical member 500 shift lights from the pixels of the individual display device toward the outside and then output the lights, and some of the output ends of the optical fiber 510 are arranged on the junction areas 300 of the multi-panel display device or the non-active area 414 of the individual display device. As a result, images can be outputted in the junction area of the multi-panel display device.

However, the sizes WIi of the input ends and the sizes WOi of the output ends of the optical fibers according to the embodiments of the present invention are not limited to the first to the third embodiments described above. For example, when all sizes of the output ends of the optical fibers are equal to each other and the size of the input end is smaller than the size of the output end, the input end may have a smaller size toward the edge or have a random size.

FIGS. 11A and 11B are cross-sectional views illustrating examples of a sectional shape of the frame section of the frame-type optical member. As described above, in the frame section 590 of the frame-type optical member of the embodiments of FIGS. 4A through 10, the frame section has a quadrangular shape including all of the inner inclined surface 530, the outer inclined surface 540, the top portion 550, and the bottom portion 560.

However, the frame section is not limited thereto. The frame section may has a right triangular shape as illustrated in 11B, and may has a triangular shape that is composed of the inner inclined surface 530', the bottom portion 560', and the outer inclined surface 540' without the top portion as illustrated in FIG. 11A.

When the frame section of the frame-type optical member has a triangular cross-section that is composed of the inner inclined surface 530', the bottom portion 560', and the outer inclined surface 540' without the top portion as illustrated in FIG. 11A, the size variation of the output ends of the optical fiber arranged in the inner inclined surface has a constant value, and thus image magnification power can be controlled to be a constant value.

Further, when the frame section of the frame-type optical member has a right triangular cross-section that is composed of only the inner inclined surface 530' and the bottom portion 560', the frame section has the merit of simple structure and constant image magnification power. In addition, since the resin support 520' is filled under the outer inclined surface, stability of the optical member can be improved.

On the other hand, as illustrated in FIGS. 4 to 10, when the frame section of the frame-type optical member has a quadrangular cross-section that is composed of the inner inclined surface 530, the outer inclined surface 540, the top portion 550, and the bottom portion 560, the output ends of the optical fibers can be arranged in the inner inclined surface 530 and the top portion 550, and thus overall thickness of the frame-type optical member can be reduced, compared to the embodiment of FIG. 11.

Figure 12A:
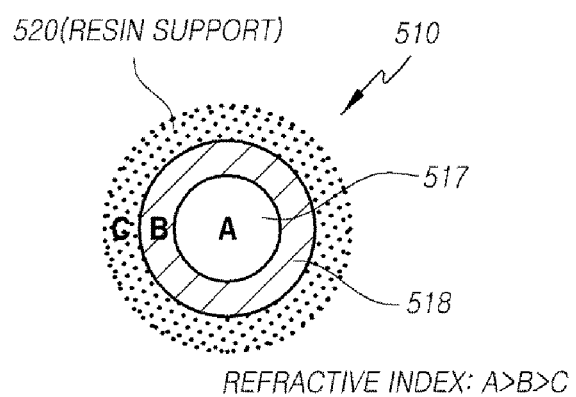
FIGS. 12A, 12B, and 12C are diagrams illustrating examples of a sectional shape of an optical fiber which can be used in the frame-type optical member according to one embodiment.
Figure 12B:
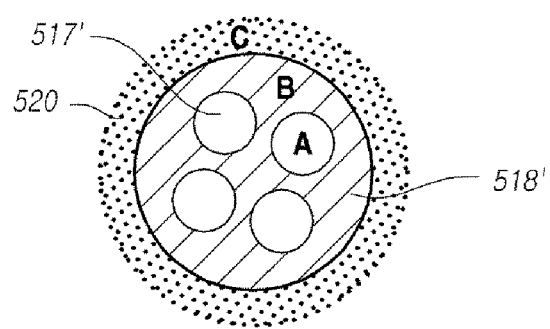
Figure 12C:
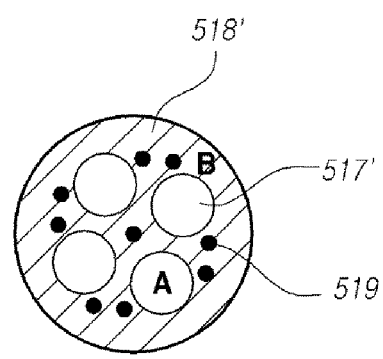
Figure 13A:
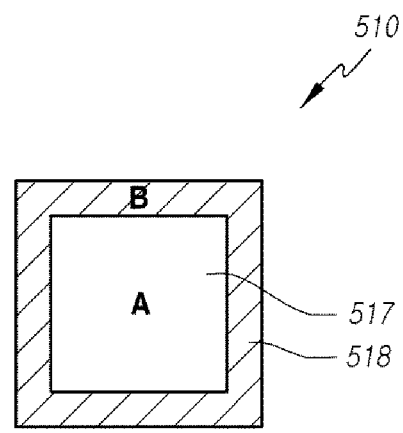
FIGS. 13A and 13B are diagrams illustrating examples of a sectional shape of an optical fiber which can be used in the frame-type optical member according to one embodiment.
Figure 13B:
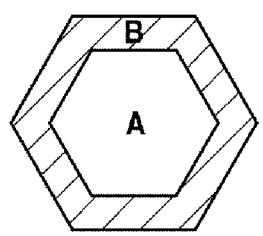

FIGS. 12A, 12B, and 12C are diagrams illustrating examples of a sectional shape of an optical fiber which can be used in the frame-type optical member according to the present invention, and FIGS. 13A and 13B are diagrams illustrating examples of a sectional shape of an optical fiber which can be used in the frame-type optical member according to the present invention.

As illustrated in FIGS. 12A, 12B, and 12C, in optical fiber 510 that are used in the frame-type optical members used in these embodiments, each optical fiber may include one or more core portions 517 and a cladding portion 518 surrounding the core portions.

Here, a refractive index A of the core portion 517 of the optical fiber 510 is larger than the a refractive index B of the cladding portion 518, and the refractive index B of the cladding portion 518 is larger than a refractive index C of the resin support 520.

Based on such refractive index relationship, lights that are inputted through input ends of the optical fiber 510 are totally reflected by the inner surface of the cladding portion 518, and thus propagate through only the core portion 517.

Further, even though some input lights transmit the inner surface of the cladding portion 518 due to incidence angles in which lights are incident on the input end of the optical fiber, total reflection of light occurs by the resin support 520 having a smaller refractive index than that of the cladding portion and thus remain inside the cladding portion 518. As a result, light leakage to the outside of the optical fiber can be reduced.

As material that can be used for the optical fiber 510 and the resin support 520 of the frame-type optical member according to the embodiments of the present invention, a light-transmitting material such as poly-methyl methacrylate (PMMA), poly carbonate (PC), poly ether sulfone (PES), methacrylate styrene (MS), polypropylene (PP), polyethylene terephthalate (PET), acryl, silica, glass is used. Accordingly, suitable materials can be selectively used depending on the refractive index relationship described above.

For example, the polymethyl methacrylate (PMMA) material has light transmittance of about 90% and the refractive index of about 1.49 to 1.50, and the poly carbonate (PC) has light transmittance of about 86% to 89% and the refractive index of about 1.57 and more.

Further, the poly ether sulfone (PES) has light transmittance of about 73% and the refractive index of about 1.65, and the methacrylate styrene (MS) has light transmittance of about 90% and the refractive index of about 1.5677. The glass has also the refractive index of about 1.89 and more.

Accordingly, for example, when the poly ether sulfone (PES) or the glass is used as material for the core portion 517 of the optical fiber 510, the poly carbonate (PC) or the methacrylate styrene (MS) is used as material for the cladding portion 518 of the optical fiber, and the polymethyl methacrylate (PMMA) or the like is used as material for the resin support 520, it is possible to guarantee optical characteristics of the frame-type optical member 500, which is required in the present invention.

However, materials for the optical fibers are not limited to the combination of materials described above. Accordingly, once a combination of materials meets the condition that the refractive index A of the core portion 517 of the optical fiber 510 is larger than the refractive index B of the cladding portion 518 and the refractive index B of the cladding portion 518 is larger than the refractive index C of the resin support 520, all materials having light transmittance of a predetermined degree and more can be used.

As illustrated in FIGS. 12A and 12B, the optical fiber 510 may include single core portion arranged in the center area, but are not limited thereto and may be a multi-core optical fiber including a bundle of core portions therein.

That is, as illustrated in FIG. 11B, the optical fiber that can be used in the frame-type optical member according to the embodiments of the present invention may be the multi-core optical fiber in which a bundle of core portions 517' are arranged in a cladding portion 518'. Accordingly, when the multi-core optical fiber is used, it is possible to increase a degree of integration per unit area of a light transmission path.

As illustrated in FIG. 12C, the cladding portion 518' of the optical fiber may include plural black beads 519 therein.

The black beads 519 absorbs noise lights that do not propagate through the core portion of the optical fiber and secede from the core portion of the optical fiber to the cladding portion or the matrix, and thus serves to decrease color mixture between neighboring optical fibers.

The black beads 519 may have a refractive index different from the refractive index of the cladding portion material.

The black beads are also made of at least one of the PMMA, the Silica, and the PC that have a color of black. The black beads may have a spherical shape, a quadrangular pyramid shape, and the like, but may have an amorphous shape that is not a certain shape.

In some cases, the black beads 519 may include at least two or more beads having refractive indexes and/or sizes different from each other so as to improve optical diffusion properties and optical absorption properties. For example, a first black bead having a diameter in the range of 1 μm to 10 μm and a first refractive index and a second black bead having a diameter in the range of 20 μm to 80 μm and a second refractive index smaller than the first refractive index by 0.02 to 0.2 may be used. Herein, required optical absorption properties can be obtained by regulating distribution density per unit volume.

FIGS. 13A and 13B are diagrams illustrating examples of a sectional shape of an optical fiber which can be used in the frame-type optical member according to the present invention.

As illustrated in FIGS. 12A, 12B, and 12C, the optical fibers used in the frame-type optical member according to the embodiments of the present invention may be a circular optical fiber having circular cross-section.

Since optical transmission efficiency of an optical fiber relates to the Fill Factor that is an area ratio of an area which the optical fiber occupies and a circular optical fiber having a circular cross section shows excellent optical transmission efficiency, it is desirable to use the circular optical fiber in the embodiments.

However, the embodiments are not limited to the circular optical fiber, and may use a polygonal optical fiber having a quadrangular cross section or a polygonal cross section as illustrated in FIG. 13A or 13B.

Particularly, the optical fibers used in the present invention are desirable to be arranged to correspond to the pixels of the individual display device that is provided below the optical fibers. Since the schematic shape of the pixel is a quadrangle, it is possible to improve a degree of matching of the input ends of the optical fibers for the corresponding pixels by using the polygonal type optical fibers illustrated in FIG. 13A or 13B.

Further, when the polygonal type optical fibers illustrated in FIGS. 13A and 13B are used, proximity between neighboring optical fibers is increased and space between the optical fibers is decreased. As a result, it is possible to improve the area ratio of optical fiber occupying areas to the entire area of the frame-type optical member.

That is, when the polygonal-type optical fibers illustrated in FIG. 13A or 13B are used, the optical fibers can be arranged to have little space between the optical fibers, and thus an area for the resin support which does not transfer lights can be reduced. As a result, it is possible to improve an optical transmission efficiency of the entire frame-type optical member.

Figure 14A:
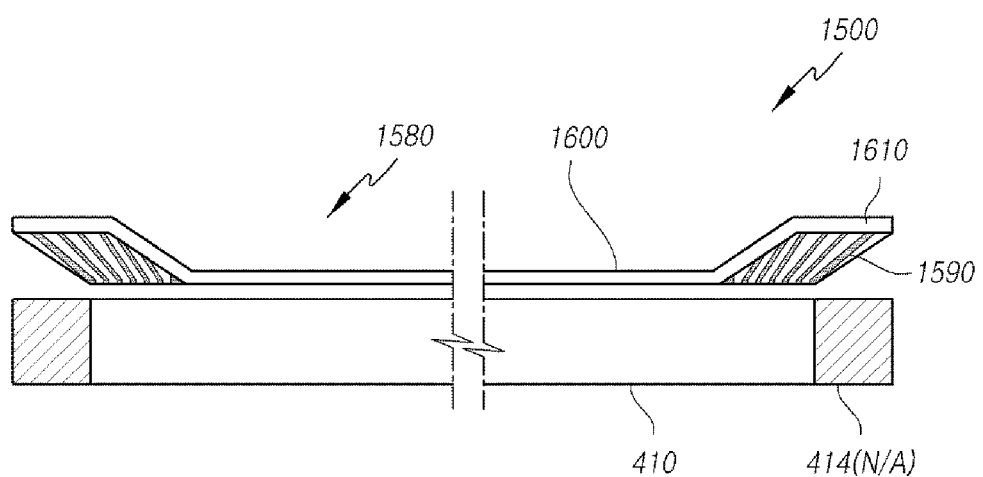
FIGS. 14A and 14B are cross-sectional views of a multi-panel display device including a frame-type optical member according to another embodiment of the present invention.
Figure 14B:
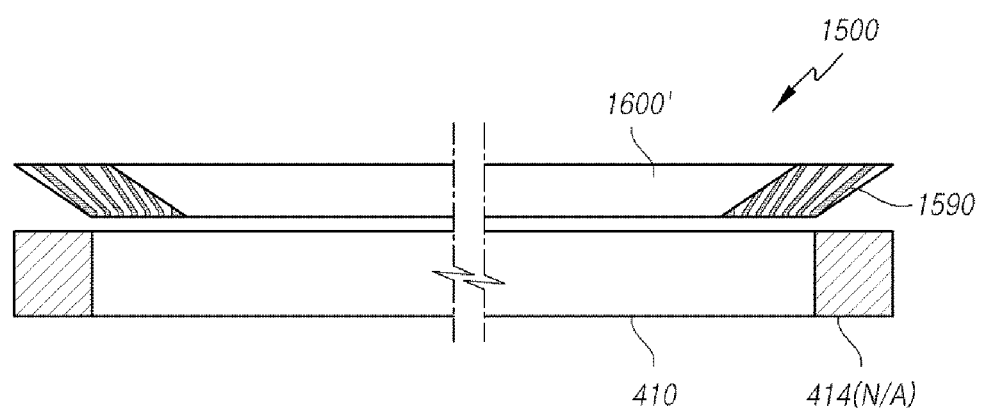

FIGS. 14A and 14B are cross-sectional views of a multi-panel display device including a frame-type optical member according to another embodiment of the present invention.

In the preceding embodiments, the central area 580 arranged in the frame section of the frame-type optical member 500 is an opening.

However, the frame-type optical member of FIG. 14 includes a frame section 1590 in which one and more optical fibers are arranged and which has an inner inclined surface, and a light-transmitting layer 1600 which is arranged in a central area 1580 in the frame section.

That is, while the frame section 1590 of the frame-type optical member 1500 is equal to that of the preceding embodiments, the central area 1580 of the frame-type optical member is not kept open and is filled with the light-transmitting layer 1600 in which a particular light-transmitting film or a light-transmitting filling material are disposed.

In FIG. 14A, a light-transmitting layer is formed by disposing a light-transmitting film on both of the top of the frame section 1590 of the frame-type optical member and the central area 1580.

Further, in FIG. 14B, the central area 1580 of the frame section 1590 is filled with a light-transmitting material to form a light-transmitting layer 1600 having the same thickness as the frame section.

Here, as the light-transmitting materials for the light-transmitting layer 1600, the same material as the resin support 520 which is used to support the optical fibers in the frame section may be used, but is not limited thereto, and the light-transmitting layer may be formed by using a material different from the resin support 520. Reference number 1610 refers to the light-transmitting layer 1600 extending over the frame section 1560.

However, in consideration of manufacturing process for the frame-type optical member 1500, it is desirable to forming the light-transmitting layer 1600 by using the same material as the resin support 520 supporting the optical fibers.

When the central area of the frame-type optical member is not kept open but is filled with a particular light-transmitting layer as described above, images of the central active areas of the individual display devices 200 can be transmitted upward, the central areas of the individual display devices can be protected from an external impact, and convenience in mounting the optical member on the multi-panel display device can be provided.

Figure 15A:
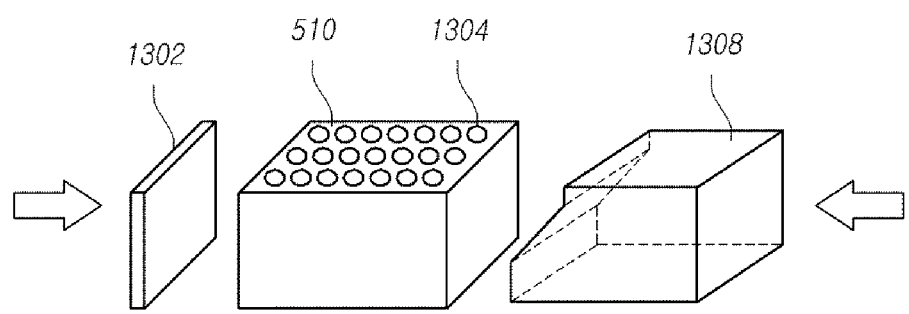
FIG. 15A is a diagram illustrating a method of manufacturing a frame-type optical member, according to one embodiment.

FIG. 15A is a diagram illustrating a method of manufacturing the frame-type optical member 500, according to one embodiment. Optical fibers 510 and resin 1304 are bundled into a block. Then the block is heated to a temperature where plastic deformation may occur in the optical fibers 510 and the resin 1304.

Figure 15B:
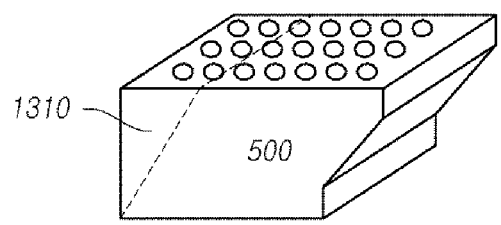
FIG. 15B is a diagram illustrating a portion of the frame-type optical member manufactured by the method of claim 13A, according to one embodiment.

Then two jigs 1302, 1308 comes into contact with the block and pushes the block in the opposite direction to mold the block into a shape as shown in FIG. 15B.

After or while pressing the block by the two jigs 1302, 1308, the block is cooled down to solidify the shape of the block and then cut along line 1310 into the frame-type optical member 500, as illustrated in FIGS. 7A and 7B.

In this way, the size WO of the output ends of the optical fibers may be made larger than the size WI of the input ends of the optical fibers. Moreover, the output surfaces of the light conduits at the right edges are shifted towards the right side relative to input surfaces of the subset of the light conduits. When junction lines of the display devices are placed below the right side of the block 500, the light from active areas of the display devices are transmitted via the optical fibers over non-active areas of the display devices.

FIG. 16 is a cross-sectional view of a multi-panel display device including a frame-type optical member according to another embodiment. The multi-panel display device of FIG. 16 includes a first viewing angle increasing plate 2600 disposed on the top portion of a frame section.

Figure 16A:
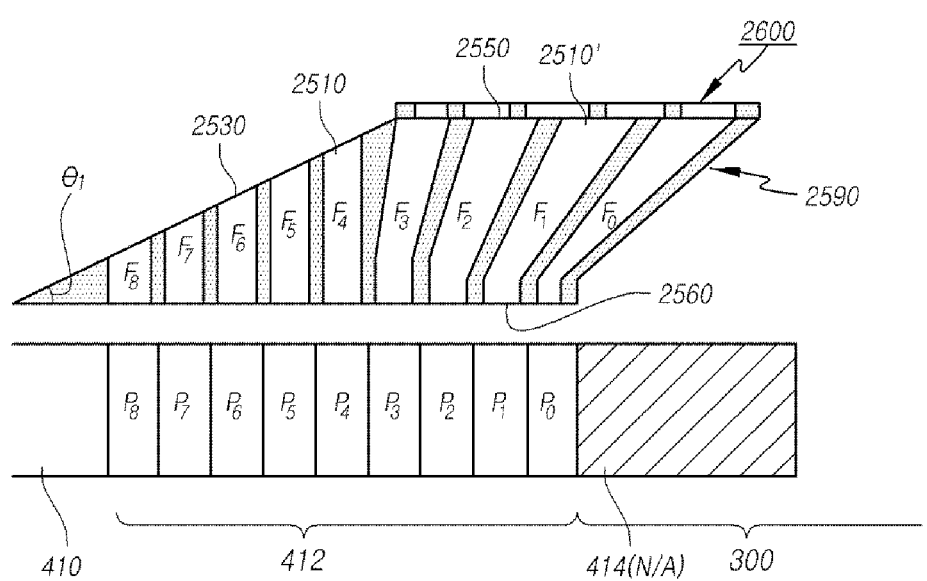
FIGS. 16A and 16B are cross-sectional views of a multi-panel display device including a frame-type optical member including a viewing angle increasing plate on top, according to one embodiment.
Figure 16B:
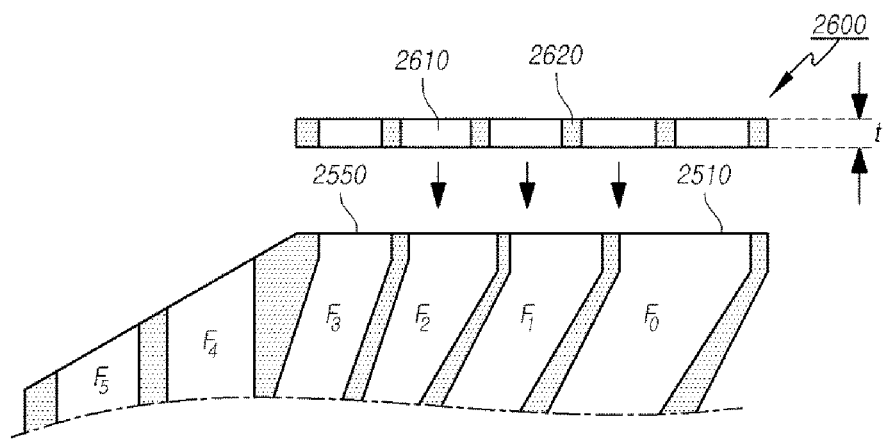

In the embodiment of FIGS. 16A and 16B, the frame section 2590 constituting the frame-type optical member includes: a bottom portion 2560 that covers a portion of the edge of a display area of an individual display device; an inner inclined surface 2530 that extends upward from the bottom portion in an inclined angle at a first angle θ1 with respect to a display panel section; and a top portion 2550 that extends from the inner inclined surface 2530 so as to be parallel to the bottom portion 2560, and a viewing angle increasing plate 2600 is additionally disposed on the top portion 2550.

The viewing angle increasing plate 2600 is a panel member that includes a plurality of linear optical fibers 2610 and support parts 2620 that are formed of a resin, etc., in order to secure the linear optical fibers, and performs the function of extending the viewing angle of light emitted through the top portion 2550 of the frame section 2590. The support parts Meanwhile, in the embodiment of FIGS. 16A and 16B, among optical fibers included in the frame section, linear optical fibers are positioned in the inner inclined surface 2530 and the top portion 2550. First optical fibers 2510 indicate optical fibers disposed in the position of the inner inclined surface 2530 and have a uniform cross-section between an input end and an output end. Second optical fibers 2510' indicate optical fibers with diameter increasing as they extend upwards and are disposed in the position of the top portion 2550. Each of the second optical fibers 2510' has an output end that is larger than its input end.

Namely, the first optical fibers 2510 that extend between the bottom portion 2560 and the inner inclined surface 2530 of the frame section 2590 have a constant diameter, as denoted by F4 to F8 in FIG. 16A. The first optical fibers F4 to F8 perform a function of transmitting and outputting light from pixels P4 to P8 in an active area 412 of the individual display panel to the top without expansion of the light.

In contrast, the second optical fibers 2510' that extend between the bottom portion 2560 and the top portion 2550 of the frame section 2590 have a gradually increasing diameter from an input end to an output end thereof, as denoted by F0 to F3 in FIGS. 16A and 16B. The second optical fibers F0 to F3 perform the function of expanding light from pixels P0 to P3, which are included in the outermost edge of the active area 412 of the individual display panel. The second optical fibers F0 to F3 transmit and output the expanded light to the upper side.

Accordingly, in the embodiment of FIGS. 16A and 16B, the inner inclined surface region of the frame section in which the first optical fibers F4 to F8 are disposed may be represented as a non-expansion portion, and the top portion of the frame section in which the second optical fibers F0 to F3 are disposed may be represented as an expansion portion.

Figure 17A:
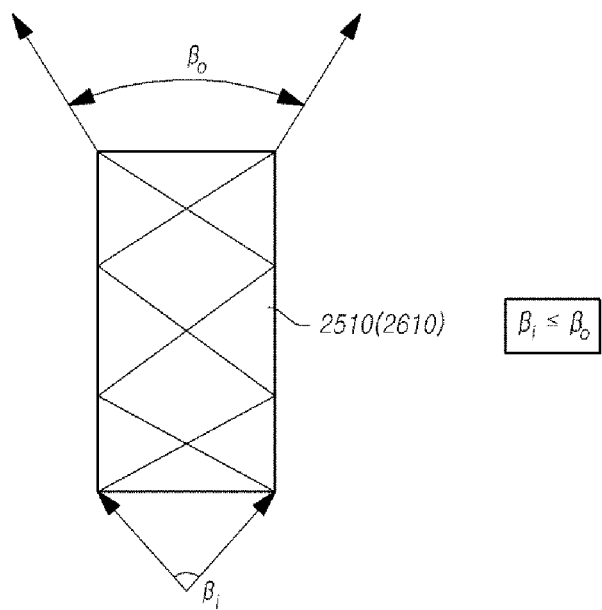
FIG. 17A is a diagram illustrating the light transmission properties of a first optical fiber in FIG. 16 having a constant diameter, according to one embodiment.
Figure 17B:
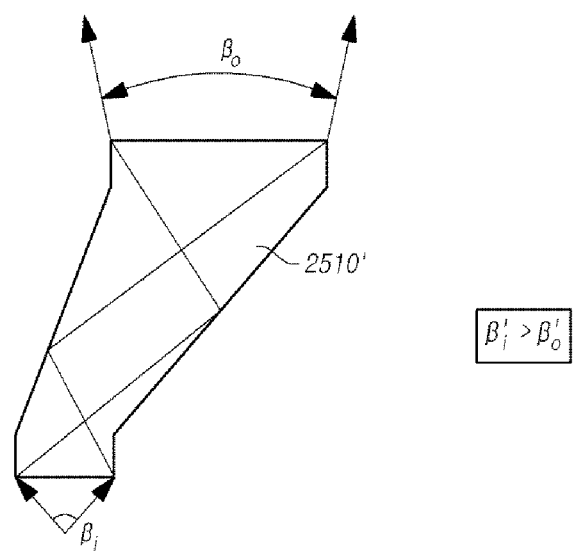
FIG. 17B is a diagram illustrating the light transmission properties of a second optical fiber in FIG. 16 having a gradually increasing diameter, according to one embodiment.

FIGS. 17A and 17B are diagrams illustrating the light transmission properties of the first and second optical fibers among the optical fibers used in this embodiment, where the first optical fibers have a constant diameter, and the second optical fibers have a gradually increasing diameter.

FIGS. 17A and 17B describe the function of the viewing angle increasing plate 2600 illustrated in FIGS. 16A and 16B. As illustrated in FIG. 17, in the case of the first optical fibers 2510, which have a constant diameter, the output viewing angle $\beta_o$ of light emitted from the output end thereof is greater than or equal to the input viewing angle $\beta_i$ of light incident on the input end thereof due to the total reflection property within the optical fibers. Namely, the first optical fibers 2510 can transmit light with a viewing angle equal to or at least greater than those of the pixels of the individual display device.

In contrast, in the case of the second optical fibers 2510' that have a gradually increasing diameter toward the output end at their top, the output viewing angle $\beta_{o''}$ of light emitted from the output end is smaller than the input viewing angle $\beta_{i'}$ of light incident on their input ends. That is, the second optical fibers 2510' transmit light with a viewing angle that is narrower than those of the pixels P0 to P3.

Accordingly, light emitted upward from the top portion 2550 of the frame section has a smaller viewing angle than light emitted from the remaining portion of the frame section when viewed in units of pixels so that the visibility of an image may be reduced when viewed from the side.

Therefore, an optical member for increasing the viewing angle is placed on the top portion 2550 of the frame section that corresponds to the expansion portion of the frame-type optical member. To this end, the viewing angle increasing plate 2600, which is a panel member including the plurality of linear optical fibers 2610 and the support parts 2620 for securing the linear optical fibers 2610, is disposed on the top portion 2550 of the frame section.

In this case, the materials and manufacturing methods for the linear optical fibers 2610 and the support parts 2620, which are included in the viewing angle increasing plate 2600, may be the same as those of the frame section 2590 of the aforementioned frame-type optical member, and therefore a detailed description thereof will be omitted in order to avoid repetition. Furthermore, the support parts included in the viewing angle increasing plate 2600 may be formed of, but are not limited to, a material, such as a resin and any material capable of supporting and securing the plurality of linear optical fibers 2610 for extending the viewing angle may be used as the material of the support parts.

Figure 18A:
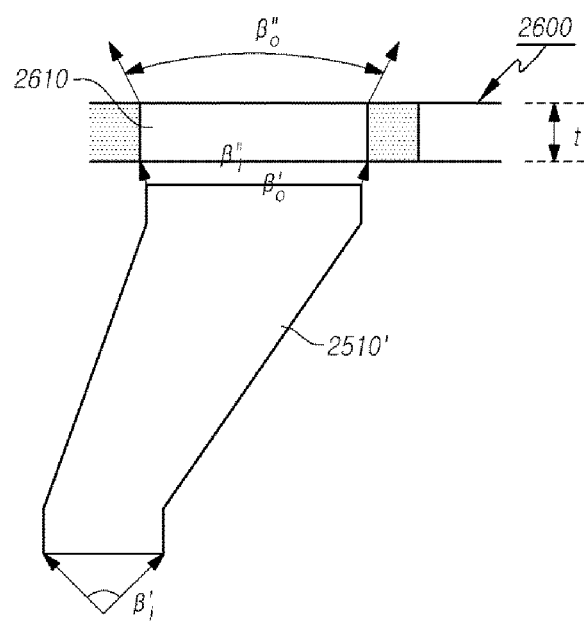
FIGS. 18A and 18B are diagrams illustrating an increased viewing angle effect of the viewing angle increasing plate of FIG. 16, according to one embodiment.
Figure 18B:
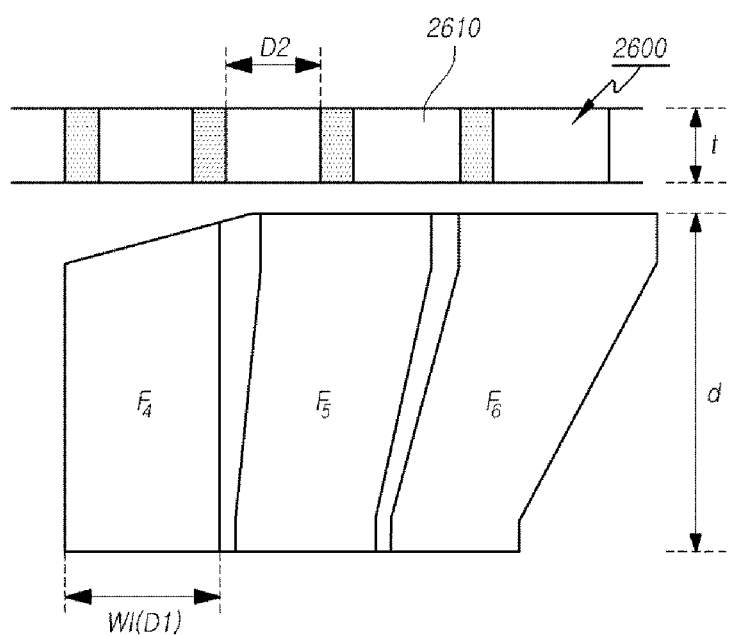

FIGS. 18A and 18B are diagrams illustrating an increased viewing angle effect of the viewing angle increasing plate used in the embodiment of FIGS. 16A and 16B.

As illustrated in FIG. 18A, the output viewing angle $\beta_{o'}$ of the output end of the second optical fiber 2510' disposed in the expansion portion is smaller than the input viewing angle $\beta_{i'}$, which is the viewing angle of a pixel, but the final output viewing angle may increase to $\beta_{o''}$ by virtue of the linear optical fiber 2610 of the viewing angle increasing plate 2600.

Namely, after the light emitted from the second optical fiber 2510' is incident on the linear optical fiber 2610 of the viewing angle increasing plate at an input viewing angle of $\beta_{i''}$, the light makes total reflection within the linear optical fiber 2610 and then departs from the viewing angle increasing plate 2600, as described above with reference to FIG. 16A. As a result, the output viewing angle increases to $\beta_{o''}$. From a user's perspective, the final viewing angle of the light $\beta_{o''}$, which closely approaches the viewing angle of the corresponding pixel. Therefore, the aforementioned viewing angle reduction due to the second optical fiber for expansion can be mitigated to a certain extent.

Meanwhile, it is desirable that the diameter D2 of the linear optical fibers 2610 included in the viewing angle increasing plate 2600 is not equal to that of the first or second optical fibers included in the frame section of the frame-type optical member, as illustrated in FIG. 18B.

More specifically, the diameter D2 of the linear optical fibers 2610 included in the viewing angle increasing plate 2600 may be preferably less than 50% or more than 200%, of the diameter D1 (or WI) of the input ends of the first or second optical fibers.

A so-called Moire phenomenon that causes stripes to be visible on account of an interference between two adjoining optical fibers becomes more prominent as the diameter D2 of the linear optical fibers 2610 approximates the diameter D1 (or WI) of the input ends of the first or second optical fibers included in the frame section.

Meanwhile, when the diameter D2 of the linear optical fibers 2610 that are included in the viewing angle increasing plate 2600 is less than 50% of the diameter D1 (or WI) of the input ends of the first or second optical fibers included in the frame section, the aforementioned Moire phenomenon may become less prominent and the increased viewing angle effect of the linear optical fibers 2610 may be increased. But the light transmittance of the viewing angle increasing plate 2600 may slightly decrease.

Furthermore, when the diameter D2 of the linear optical fibers 2610 that are included in the viewing angle increasing plate 2600 is more than 200% of the diameter D1 (or WI) of the input ends of the first or second optical fibers included in the frame section, the aforementioned Moire phenomenon may become less prominent and the viewing angle increasing plate may have an excellent light transmittance. But the viewing angle increase effect of the linear optical fibers 2610 may be restricted to a certain extent.

Accordingly, the linear optical fibers 2610 that are included in the viewing angle increasing plate 2600 may be configured to have a diameter D2 that is less than 50% or more than 200% of the diameter D1 (or WI) of the input ends of the first or second optical fibers included in the frame section, thereby compensating for the viewing angle reduction of the second optical fibers while reducing the Moire phenomenon.

In particular, it is possible to increase light transmittance and enlarge the viewing angle by selecting diameter D2 to have a diameter of less than 50% of the diameter D1 or a diameter of more than 200% of the diameter D1.

Furthermore, the viewing angle increasing plate 2600, according to this embodiment, may preferably have a thickness t of about 0.1 mm to about 3 mm. In this case, the thickness t of the viewing angle increasing plate 2600 may be determined according to the diameter D of the linear optical fibers since the increased viewing angle effect may vary depending on the diameter D of the linear optical fibers included in the viewing angle increasing plate 2600. However, when the viewing angle increasing plate 2600 has a thickness t of 0.1 mm or less despite the diameter D2 of the linear optical fibers included therein, the increased viewing angle effect is insufficient, and manufacturing of the viewing angle increasing plate becomes difficult. And, in cases where the viewing angle increasing plate 2600 has a thickness t of 3 mm or more, the thickness of the entire optical member (that is, the sum of the thickness d of the frame section and the thickness t of the viewing angle increasing plate as in FIG. 18A) increases.

Accordingly, in this embodiment, the viewing angle increasing plate 2600 is configured to have a thickness t of about 0.1 mm to about 3 mm, thereby reducing the thickness of the whole member while and ensuring the increase of viewing angle and facilitate the manufacturability of the viewing angle increasing plate.

Figure 19:
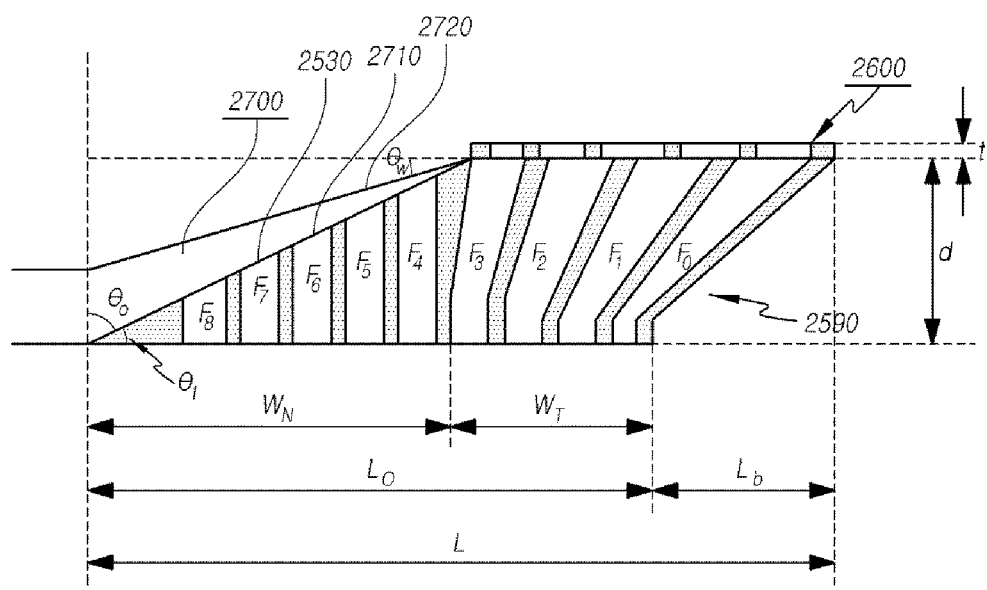
FIG. 19 is a cross-sectional view of a frame-type optical member with a refraction compensating member disposed on the inner inclined surface of a frame section, according to one embodiment.

FIG. 19 is a cross-sectional view of a frame-type optical member with a refraction compensating member disposed on the inner inclined surface of a frame section, according to one embodiment. In the embodiment of FIG. 19, the refraction compensating member 2700 has a high refractive index, and is formed of a light-transmitting material. The refraction compensating member 2700 is additionally disposed on the inner inclined surface 2530 constituting the frame section 2590 of the frame-type optical member.

The refraction compensating member 2700 is a light-transmitting optical member formed of a material that has a refractive index (for example, ±0.3) similar to the material constituting the frame section 2590 of the frame-type optical member; namely, the material constituting optical fibers 2510 and 2510' and support parts that are included in the frame section.

More specifically, the refraction compensating member 2700 is formed of a light-transmitting material having a refractive index of about 1.4 or more, and is preferably formed of a glass material having a refractive index of about 1.6 or more. For example, the refraction compensating member 2700 may be formed of Poly-Methyl MethaCrylate (PMMA), Poly Carbonate (PC), Poly Ether Sulfone (PES), Methacrylate Styrene (MS), PolyPropylene (PP), PolyEthylene Terephthalate (PET), acryl, silica, glass, etc. that have a light-transmitting property.

The refraction compensating member 2700 includes the bottom 2710 and the top 2720. The bottom 2710 makes contact with the inner inclined surface 2530 of the frame section, and the top 2720 is exposed to the outside of the optical member.

Furthermore, the refraction compensating member 2700 is disposed to cover the central area 1580 in the frame section as illustrated in FIGS. 14A and 14B, in addition to covering the inner inclined surface 2530 of the frame section.

The refraction compensating member 2700 performs a function of compensating for an optical-path alignment offset that occurs on the output ends of the first optical fibers 2510 disposed in the position of the inner inclined surface of the frame section of the frame-type optical member, according to this embodiment, and a more detailed description thereof will be given below with reference to FIG. 20.

Figure 20A:
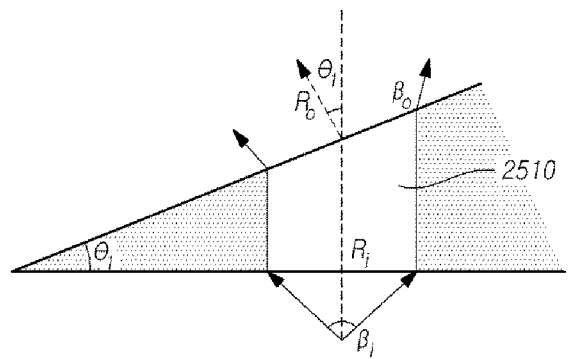
FIGS. 20A and 20B are diagrams illustrating a light-refraction compensation effect of the refraction compensating member, according to one embodiment.
Figure 20B:
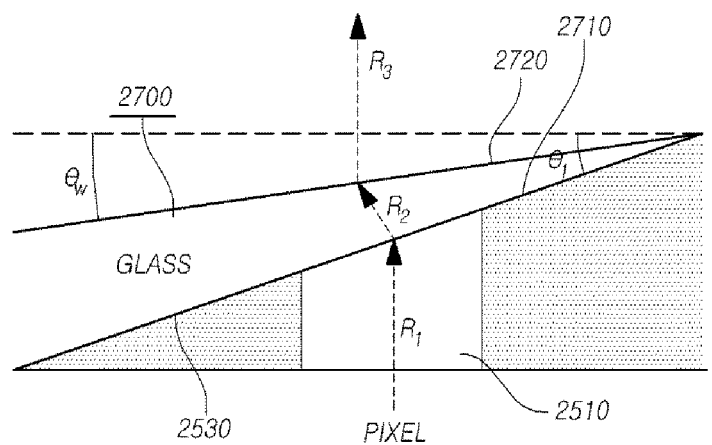

FIGS. 20A and 20B are diagrams illustrating a light-refraction compensation effect by virtue of the refraction compensating member, according to one embodiment. As illustrated in FIG. 20A, the first optical fiber 2510 disposed in the position of the inner inclined surface of the frame section has a constant diameter, but is formed such that the output end of the first optical fiber is inclined at a first acute angle θ1 with respect to the surface of an individual display device due to the first acute angle θ1 of the inner inclined surface.

Accordingly, the direction of light Ro emitted from the output end of the first optical fiber 2510 is not the same as the direction of light Ri incident on the input end of the first optical fiber. Such a phenomenon is referred to herein as an optical-path alignment offset of the first optical fiber.

Namely, as illustrated in FIG. 20A, the light Ro emitted from the first optical fiber is inclined at the first angle θ1 with respect to the incident light Ri so that light from a pixel that is disposed below the first optical fiber is emitted while being misaligned by the optical-path alignment offset instead of being directed in the perpendicular direction to the surfaces of the individual display devices 410.

Due to the difference in the direction of the light emitted from the inner inclined surface of the frame section and the light emitted from the remaining portion (i.e., the central area in the frame section and the top of the frame section), discontinuity of an image or distortion in the image occurs when viewed by an observer.

The refraction compensating member 2700 according to this embodiment is used to compensate for the optical-path alignment offset phenomenon to a certain extent. As illustrated in FIG. 20B, since the refraction compensating member 2700 is an optical member (formed of glass, etc.) disposed on the inner inclined surface of the frame section of a predetermined thickness with a refractive index of 1.4 or more which is lower or higher than the refractive index of the optical fibers 2510, light R2 emitted from the first optical fiber 2510 is first refracted by the bottom 2710 of the refraction compensating member as shown in FIG. 20B. The light R2 that entered through the refraction compensation member 2720 passes through the refraction compensation member 2720 and is then again refracted at the top 2720 of the refraction compensating member so that the light R3 emitted from the top of the refraction compensating member proceeds in a direction similar to that of the first incident light R1. Accordingly, the optical-path alignment offset illustrated in FIG. 20A may be reduced to a certain extent.

In particular, the top 2720 of the refraction compensating member 2700, according to this embodiment, is inclined at a second tilt angle θw with respect to the horizontal plane so that the compensation performance for the optical-path alignment offset increases by virtue of the secondary refraction as the second tilt angle θw decreases. For reference, the first tilt angle, at which the bottom of the refraction compensating member 2700 is inclined with respect to the horizontal plane, is the same as the first angle θ1 of the inner inclined surface 2530 of the frame section.

Namely, the compensation performance for the optical-path alignment offset increases as the difference in the tilt angle relative to the horizontal plane between the top and the bottom of the refraction compensating member 2700 increases, but the total thickness of the refraction compensating member may also increase as the second tilt angle θw of the top 2720 of the refraction compensating member 2700 decreases.

Accordingly, in this embodiment, it is possible to design the degree of compensation for the optical-path alignment offset by properly adjusting the second tilt angle θw in the range of 0 degree to the first angle θ1 of the inner inclined surface of the frame section, and a more detailed description is provided below with reference to FIGS. 21A through 21C.

Figure 21A:
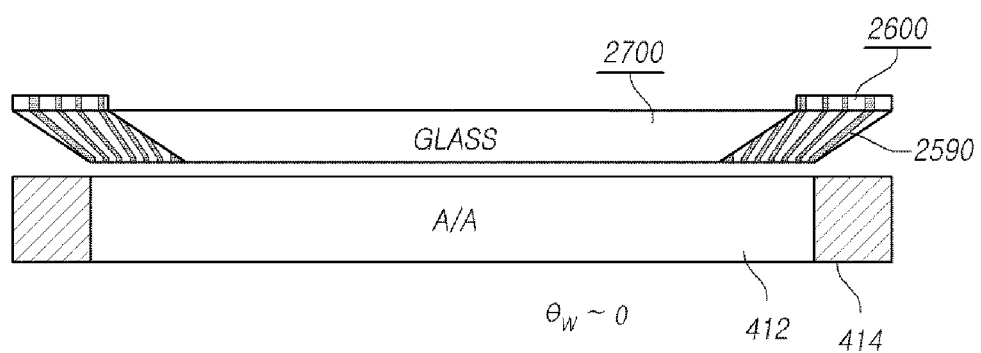
FIGS. 21A through 21C are sectional diagrams illustrating various shapes of the refraction compensating member according to the embodiment of FIG. 19.
Figure 21B:
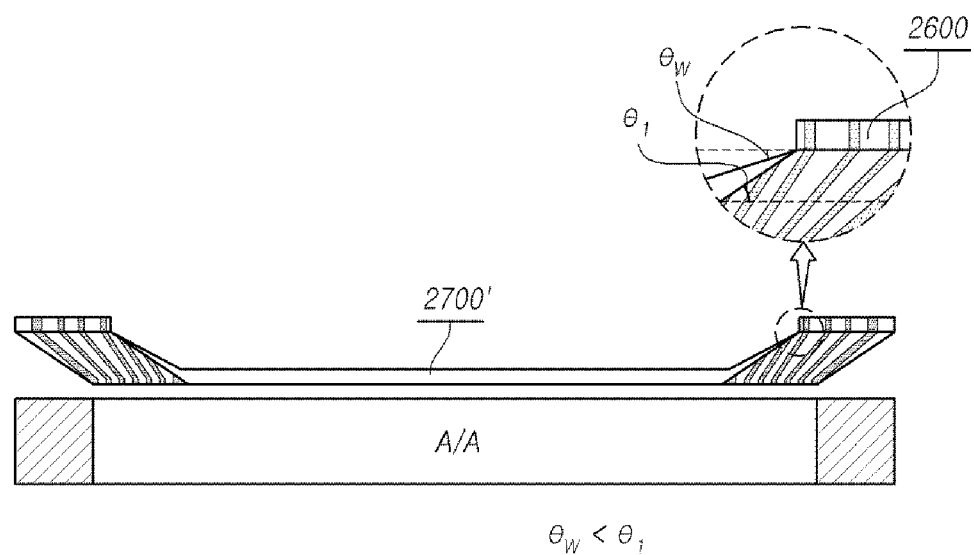
Figure 21C:
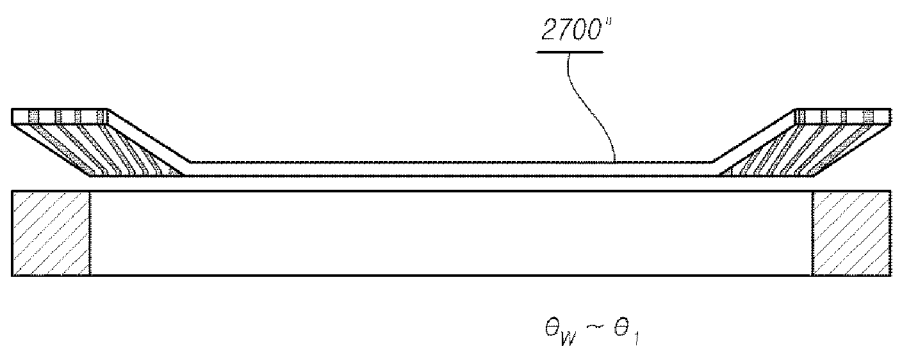

FIGS. 21A through 21C are sectional diagrams illustrating various shapes of the refraction compensating member 2700 according to embodiments of FIG. 19. More specifically, FIGS. 21A through 21C illustrate various shapes with a different magnitude of the second tilt angle θw that the top 2720 of the refraction compensating member 2700 makes with the horizontal plane.

FIG. 21A illustrates a case in which the second tilt angle θw of the top of the refraction compensating member 2700 is 0 degrees; that is, a case in which the top of the refraction compensating member 2700 and the horizontal plane are in the same plane.

In this case, as described above with reference to FIG. 20B, the amount of secondary refraction increases to increase compensation for an optical-path alignment offset, and in theory, it is possible to reduce the amount of the optical-path alignment offset due to the inner inclined surface of the frame section by making the direction of the viewing angle of light emitted from the top of the refraction compensating member 2700 approximately match with that of the viewing angle of the corresponding pixel.

FIG. 21C illustrates a case in which the second tilt angle θw of the top of a refraction compensating member 2700'' is nearly the same as the first angle θ1 of the inner inclined surface of the frame section 2590. In this case, the refraction compensating member is formed as an optical panel member that has a predetermined thickness and covers the upper side of the central area of an individual display device and the inner inclined surface of the frame section of the frame-type optical member.

In the case of FIG. 21C, the degree of compensation for the optical-path alignment offset may decrease slightly compared with the case of FIG. 21A, but it is possible to reduce the total thickness and weight of the refraction compensating member 2700''.

FIG. 21B illustrates a case in which the second tilt angle θw of the top of a refraction compensating member 2700' is greater than 0 degrees and is less than the first angle θ1 of the inner inclined surface of the frame section 2590.

Using the embodiment of FIG. 21B, it is possible to improve the degree of compensation for an optical-path alignment offset and the total thickness and weight of the frame-type optical member by properly adjusting the second tilt angle θw of the top of the refraction compensating member 2700'. Namely, it is possible to set the second tilt angle θw of the top of the refraction compensating member 2700' in consideration of the amount of the occurring optical-path alignment offset and the desired thickness/weight of the optical member.

Figure 22A:
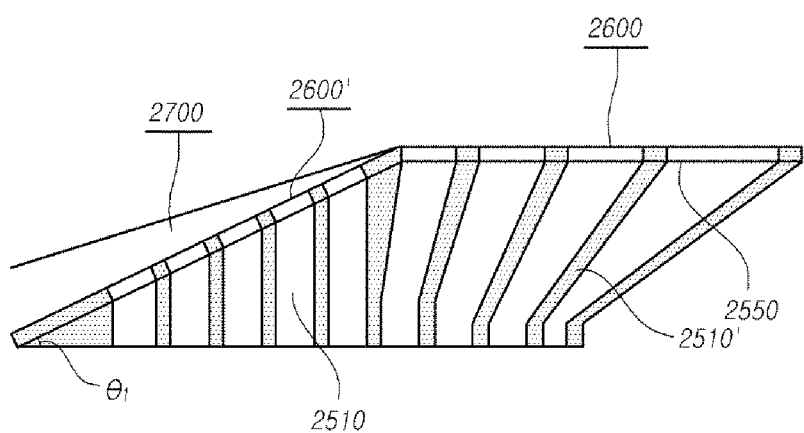
FIGS. 22A through 22C illustrates a frame-type optical member with two viewing angle increasing plates and a refraction compensating member, according to one embodiment.

FIG. 22A illustrates a frame-type optical member according to yet another embodiment of the present invention. The frame-type optical member, according to the embodiment illustrated in FIG. 22, has a structure in which a second viewing angle increasing plate 2600' is disposed on the inner inclined surface 2530 of the frame section thereof, in addition to the viewing angle increasing plate 2600 disposed on the top portion 2550 of the frame section thereof. A refraction compensating member 2700 is disposed on the second viewing angle increasing plate.

Since the inner inclined surface 2530 of the frame section of the frame-type optical member is inclined at the first angle θ1 with respect to the horizontal plane as described above, the output ends of first optical fibers 2510 formed along the inner inclined surface 2530 are also inclined at a predetermined angle with respect to the horizontal plane.

Figure 22B:
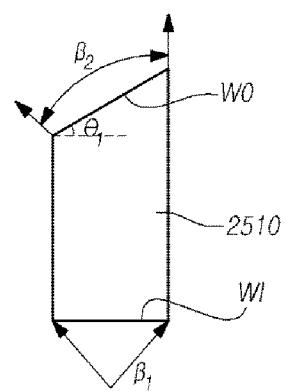

Accordingly, as illustrated in FIG. 22B, the viewing angle β2 of light emitted from the output ends of the first optical fibers 2510 may be smaller than the viewing angle β1 of light incident on the input ends of the first optical fibers due to the inclination of the output ends of the first optical fibers.

Accordingly, the function of increasing a viewing angle may also be required for the first optical fibers that are disposed in the position of the inner inclined surface 2530 of the frame section. To this end, in the embodiment of FIG. 22A, the second viewing angle increasing plate 2600' is additionally disposed on the inner inclined surface 2530 of the frame section.

In this case, the second viewing angle increasing plate 2600' differs from the viewing angle increasing plate 2600 illustrated in FIGS. 16A to 18C only in the position thereof, and may be the same as the viewing angle increasing plate 2600 in the detailed configuration, such as the material, the shape, etc.

Namely, the second viewing angle increasing plate 2600' is a panel member that is constituted by a plurality of linear optical fibers and support parts for coupling the linear optical fibers.

Furthermore, the linear optical fibers included in the second viewing angle increasing plate 2600' may be configured to have a diameter less than 50%, or more than 200%, of the diameter D1 (or WI) of the first optical fibers included in the frame section, thereby compensating for the viewing angle reduction of the first optical fibers, which is the unique function of the viewing angle increasing plate, and minimizing the Moire phenomenon.

In addition, in the embodiment of FIG. 22A, the refraction compensating member 2700 is additionally disposed on the second viewing angle increasing plate 2600' to compensate for the optical-path alignment offset caused by the inner inclined surface. Since the refraction compensating member has the same configuration as the refraction compensating member described above with reference to FIGS. 19 to 21, a detailed description thereof will be omitted.

In this case, the refraction compensating member 2700 that is disposed on the second viewing angle increasing plate 2600' may be preferably formed of a material that has a similar refractive index (for example, ±0.3) to the material that constitutes the frame section or the second viewing angle increasing plate 2600'.

Figure 22C:
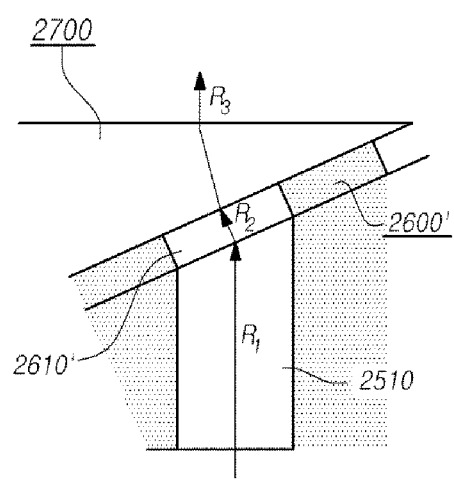

As illustrated in FIG. 22C, when the first light R1, having passed through the first optical fiber 2510, passes through the linear optical fiber of the second viewing angle increasing plate 2600', the viewing angle thereof increases (R2), and the light is refracted while passing through the top of the refraction compensating member 2700 so that the optical-path alignment offset due to the first angle θ1 of the inner inclined surface is compensated for and the final light R3 is emitted.

Of course, in the embodiment of FIG. 22A, the first viewing angle increasing plate 2600 may be disposed on the top portion 2550 of the frame section to compensate for the viewing angle reduction due to an increase in the diameter of the second optical fibers 2510' that are disposed in the expansion portion.

As described above, according to the embodiment of FIG. 22A, the second viewing angle increasing plate 2600' and the first viewing angle increasing plate 2600 are disposed on the inner inclined surface 2530 and the top portion 2550 of the frame section, respectively, to compensate for the viewing angle reduction due to the inner inclined surface and the increase in the diameter of the second optical fibers, and the refraction compensating member 2700 is disposed on the second viewing angle increasing plate 2600' to compensate for the optical-path alignment offset caused by the inner inclined surface.

Figure 23:
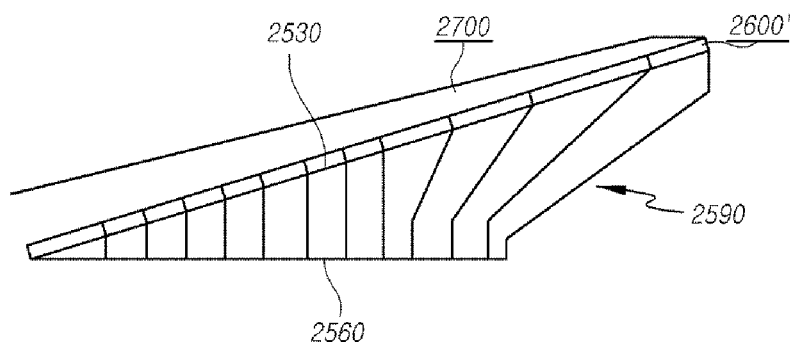
FIG. 23 illustrates a frame-type optical member with a frame section is only constituted by the inner inclined surface without a top portion, and a second viewing angle increasing plate and a refraction compensating member are disposed on the inner inclined surface, according to one embodiment.

FIG. 23 illustrates a frame-type optical member according to yet another embodiment of the present invention. In the embodiment of FIG. 23, the frame-type optical member has a configuration in which the frame section 2590 thereof is only constituted by the inner inclined surface 2530 without a top portion, and a second viewing angle increasing plate 2600' and a refraction compensating member 2700 are sequentially disposed on the inner inclined surface.

In the embodiment of FIG. 23, first optical fibers having a constant diameter and second optical fibers having a gradually increasing diameter are all disposed between the inner inclined surface 2530 and the bottom portion 2560, in which case the second optical fibers are disposed on the outside of the first optical fibers.

As described above, in the multi-panel display device in which plural individual display devices are joined, it is possible to guarantee image continuity in the panel junction areas by disposing the frame-type optical member including optical fibers, which receive light from pixels and output the light to areas covering the junction areas of the individual display devices, in front of the multi-panel display device. Particularly, by optimizing the structure of the inner inclined surface of the frame section of the frame-type optical member and the structure of the optical fibers included in the frame section, it is possible to provide an image which is continuous and natural in the panel junction areas of the multi-panel display device.

In addition, it is possible to compensate for a viewing angle reduction that is caused by a difference in the size between the input ends and the output ends of optical fibers by disposing a viewing angle increasing plate on the inner inclined surface or the top portion of the frame section of a frame-type optical member. It is also possible to compensate for an optical-path alignment offset caused by the inner inclined surface of the frame section by disposing a refraction compensating member, which is formed of a material (such as glass, etc.) on the inner inclined surface of the frame section.

The above description and the accompanying drawings exemplify the technical idea of the present invention, and various modifications and changes such as combination, separation, substitution, and alteration of configurations can be made by those skilled in the art without departing from the essential features of the invention. Accordingly, the embodiments disclosed in the invention are not to restrict the technical idea of the invention but to explain the technical idea of the invention. The technical idea of the invention is not limited to the embodiments. The scope of the invention is defined by the appended claims, and all the technical ideas within a range equivalent thereto should be construed as belonging to the scope of the invention.

What is claimed is:

1. A multi-panel display device, comprising:
   a plurality of adjoining individual display devices; and
   an optical member on the plurality of individual display devices, the optical member comprising:
     a frame section covering junction areas of the individual display devices where images are not displayed and portions of display areas of the individual display devices adjacent to the junction areas, the frame section comprising a plurality of light conduits, at least one portion of the frame section comprising:
       a bottom surface facing a display area of an individual display device, and
       an inner inclined surface extending from the bottom surface and facing away from the individual display device; and
     a refraction compensating member on the inner inclined surface, light received from the inclined surface refracted by the refraction compensation member in a direction perpendicular to surfaces of the individual display devices, wherein the refraction compensating member comprises a first surface facing the inner inclined surface, and a second surface facing away from the inner inclined surface, the first surface forming an acute angle relative to the second surface, and the second surface forming another acute angle relative to the surface of the individual display devices.

2. The multi-panel display device of claim 1, wherein each of the light conduits comprises:
   a first surface configured to receive light from the covered portions of the display areas; and
   a second surface facing away from the individual display device.

3. The multi-panel display device of claim 2, wherein a center of the second surface of a light conduit is shifted towards a junction area relative to a center of the first surface of the light conduit, the junction area adjacent to a portion of the frame section that includes each of the light conduits.

4. The multi-panel display device of claim 1, wherein the frame section further comprises:
   an outer inclined surface extending from the bottom surface, the outer inclined surface extending over a non-display area of the display device and facing a junction area between the individual display device and an adjacent individual display device,
   wherein a first acute angle between the inner inclined surface and the bottom surface is smaller than a second acute angle between the outer inclined surface and the bottom surface.

5. The multi-panel display device of claim 1, further comprising a viewing angle increasing plate between the refraction compensating member and the inner inclined surface, the viewing angle increasing plate configured to receive first light with a first viewing angle from the light conduits forming the inner inclined surface and transmit second light of a second viewing angle larger than the first viewing angle from a second side facing away from the inner inclined surface.

6. The multi-panel display device of claim 2, wherein a first surface of a light conduit is equal to or smaller than a pixel or a sub-pixel of the individual display devices, and the second surface is larger than the first surface of the light conduit.

7. The multi-panel display device of claim 1, wherein the at least one portion of the frame section further comprises:
   a top surface extending over at least a non-display area of the individual display device and facing away from the individual display device, the inner inclined surface between the top surface and the bottom surface.

8. The multi-panel display device of claim 1, wherein the plurality of light conducts have a first refractive index, and wherein the frame section further comprises:
   cladding portions of a second refractive index lower than the first refractive index, the cladding portions surrounding the plurality of light conduits,
   wherein each of the light conduits and the cladding portions are surrounded by supporting material having a third refractive index lower than the first refractive index and the second refractive index.

9. The multi-panel display device of claim 1, wherein the optical member further comprises a light-transmitting layer between the frame section and another frame section.

10. An optical member for multi-panel display device, comprising:
    a first frame section covering junction areas of first and second individual display devices where images are not displayed and portions of display areas of the first and second individual display devices adjacent to the junction areas, the first frame section comprising a plurality of light conduits, at least one portion of the first frame section comprising:
      a bottom surface facing a display area of the first individual display device, and an inner inclined surface extending from the bottom surface and facing away from the first individual display device; and a refraction compensating member on the inner inclined surface, light received from the inclined surface refracted by the refraction compensation member in a direction perpendicular to surfaces of the individual display devices, wherein the refraction compensating member comprises a first surface facing the inner inclined surface, and a second surface facing away from the inner inclined surface, the first surface forming an acute angle relative to the second surface, and the second surface forming another acute angle relative to the surface of the individual display devices.

11. The optical member of claim 10, further comprising:
a second frame section connected to the first frame section, the second frame section covering junction areas of the first individual display device and a third individual display device adjacent to the first individual display device.

12. The optical member of claim 10, wherein each of the light conduits comprises:
a first surface configured to receive light from the covered display areas; and
a second surface facing away from the individual display device.

13. The optical member of claim 12, wherein a center of the second surface of a light conduit is shifted towards a junction area relative to a center of the first surface of a light conduit, the junction area adjacent to a portion of the frame section that includes each of the light conduits.

14. The optical member of claim 10, wherein the frame section further comprises:
an outer inclined surface extending from the bottom surface, the outer inclined surface extending over a non-display area of the display device and facing a junction area between the individual display device and an adjacent individual display device,
wherein a first acute angle between the inner inclined surface and the bottom surface is smaller than a second acute angle between the outer inclined surface and the bottom surface.

15. A multi-panel display device, comprising:
a plurality of adjoining individual display devices; and
an optical member on the plurality of individual display device, the optical member comprising:
a frame section covering junction areas of the individual display devices where images are not displayed and portions of display areas of the individual display devices adjacent to the junction areas, the frame section comprising a plurality of light conduits of a first refractive index and cladding portions of a second refractive index lower than the first refractive index, the cladding portions surrounding the plurality of light conduits, at least one portion of the frame section comprising:
a bottom surface facing a display area of an individual display device,
an inner inclined surface extending from the bottom surface and facing away from the individual display device, an outer inclined surface extending from the bottom surface, the outer inclined surface extending over a non-display area of the display device and facing a junction area between the individual display device and an adjacent individual display device, and a top surface facing away from the display area of the individual display device, the top surface extending from an edge of the inner inclined surface to an edge of the outer inclined surface, the top surface parallel to the bottom surface; and a refraction compensating member on the inner inclined surface, light received from the inclined surface refracted by the refraction compensation member in a direction perpendicular to surfaces of the individual display devices, wherein the refraction compensating member comprises a first surface facing the inner inclined surface, and a second surface facing away from the inner inclined surface, the first surface forming an acute angle relative to the second surface, and the second surface forming another acute angle relative to the surface of the individual display devices.

16. The optical member of claim 15, further comprising a viewing angle increasing plate between the refraction compensating member and the inner inclined surface, the viewing angle increasing plate configured to receive first light with a first viewing angle from the light conduits forming the inner inclined surface and transmit second light of a second viewing angle larger than the first viewing angle from a second side facing away from the inner inclined surface.

17. The optical member of claim 10, wherein the at least one portion of the first frame section further comprises:
a top surface extending over at least a non-display area of the first individual display device and facing away from the first individual display device, the inner inclined surface between the top surface and the bottom surface.

18. The optical member of claim 10, wherein the plurality of light conducts have a first refractive index, and wherein the frame section further comprises:
cladding portions of a second refractive index lower than the first refractive index, the cladding portions surrounding the plurality of light conduits,
wherein each of the light conduits and the cladding portions are surrounded by supporting material having a third refractive index lower than the first refractive index and the second refractive index.

19. The optical member of claim 1,
wherein each of the individual devices include a plurality pixels, and
wherein each light conduit of the plurality of light conduits corresponds to one pixel of the plurality of pixels.

20. The optical member of claim 10,
wherein each of the first and second individual devices include a plurality pixels, and
wherein each light conduit of the plurality of light conduits corresponds to one pixel of the plurality of pixels.

* * * * *